(12) United States Patent
Ofuji et al.

(10) Patent No.: US 8,507,910 B2
(45) Date of Patent: Aug. 13, 2013

(54) ACTIVE MATRIX DISPLAY APPARATUS

(75) Inventors: Masato Ofuji, Kawasaki (JP); Katsumi Abe, Kawasaki (JP); Masafumi Sano, Yokohama (JP); Hideya Kumomi, Tokyo (JP); Ryo Hayashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 648 days.

(21) Appl. No.: 12/520,944

(22) PCT Filed: Jan. 17, 2008

(86) PCT No.: PCT/JP2008/050926
§ 371 (c)(1),
(2), (4) Date: Jun. 23, 2009

(87) PCT Pub. No.: WO2008/093583
PCT Pub. Date: Aug. 7, 2008

(65) Prior Publication Data
US 2010/0090205 A1 Apr. 15, 2010

(30) Foreign Application Priority Data
Jan. 29, 2007 (JP) .................................. 2007-017874

(51) Int. Cl.
*H01L 29/00* (2006.01)
(52) U.S. Cl.
USPC ...... 257/59; 257/E23.141; 257/686; 257/690; 438/149; 438/29
(58) Field of Classification Search
USPC ..... 257/59, 72, 680, 696, E23.141; 438/149, 438/29
See application file for complete search history.

(56) References Cited

U.S. PATENT DOCUMENTS

| 6,046,547 A | 4/2000 | Nishio et al. ............... 315/169.3 |
| 6,104,461 A | 8/2000 | Zhang et al. .................. 349/122 |

(Continued)

FOREIGN PATENT DOCUMENTS

| JP | 10-232628 A | 9/1998 |
| JP | 2002-311857 | 10/2002 |

(Continued)

OTHER PUBLICATIONS

International Search Report and Written Opinion in PCT/JP2008/050926.

(Continued)

*Primary Examiner* — Eugene Lee
*Assistant Examiner* — Elias M Ullah
(74) *Attorney, Agent, or Firm* — Fitzpatrick, Cella, Harper & Scinto

(57) ABSTRACT

An active matrix display apparatus includes a transistor, a storage capacitor, and a light-emitting element formed on a substrate. The transistor includes a source electrode, a drain electrode, and a gate electrode. The storage capacitor has a multilayered structure of a first electrode, a dielectric layer, and a second electrode stacked in this order on the substrate, and the light-emitting element has a multilayered structure of a third electrode, a light-emitting layer, and a fourth electrode stacked in this order on the substrate. The first electrode is electrically connected to the gate electrode of the transistor, and at least a part of the storage capacitor is disposed between the substrate and the light-emitting element. All of the substrate, the first electrode, the second electrode, and the third electrode are formed from a material transmitting a visible light emitted by the light-emitting element. Viewing from a top of the substrate, a region for storing charges in the storage capacitor includes or is equal to a light-emitting region of the light-emitting element.

16 Claims, 18 Drawing Sheets

(56) References Cited

U.S. PATENT DOCUMENTS

| | | |
|---|---|---|
| 6,825,496 B2 | 11/2004 | Yamazaki et al. ............... 257/72 |
| 7,189,992 B2 | 3/2007 | Wager, III et al. ............... 257/43 |
| 7,242,024 B2 | 7/2007 | Yamazaki et al. ............... 257/72 |
| 7,872,259 B2 | 1/2011 | Den et al. |
| 2002/0001886 A1 | 1/2002 | Ohtani ............................ 438/151 |
| 2003/0218222 A1 | 11/2003 | Wager, III et al. ............ 257/410 |
| 2004/0155846 A1 | 8/2004 | Hoffman et al. ................. 345/87 |
| 2005/0121677 A1* | 6/2005 | Kim et al. ........................ 257/72 |
| 2005/0236629 A1* | 10/2005 | Lee et al. ......................... 257/79 |
| 2005/0285108 A1* | 12/2005 | Choi ................................. 257/59 |
| 2006/0113549 A1 | 6/2006 | Den et al. |
| 2006/0169979 A1 | 8/2006 | Endo ................................ 257/59 |
| 2007/0252150 A1 | 11/2007 | Yamazaki et al. ............... 257/66 |
| 2011/0017996 A1 | 1/2011 | Den et al. |

FOREIGN PATENT DOCUMENTS

| | | |
|---|---|---|
| JP | 2005-011571 A | 1/2005 |
| JP | 2006-186319 A | 7/2006 |
| WO | WO 2005/093846 | 10/2005 |
| WO | WO 2005/093847 | 10/2005 |
| WO | WO 2005/093848 | 10/2005 |
| WO | WO 2005/093849 | 10/2005 |
| WO | WO 2005/093850 | 10/2005 |
| WO | WO 2005/093851 | 10/2005 |
| WO | WO 2005/093852 | 10/2005 |

OTHER PUBLICATIONS

Wager et al., "Transparent electronics and prospects for transparent displays," *Proceedings of the SPIE*, vol. 5080 (2003) pp. 330-339.

Kenji Nomura et al., "Room-temperature fabrication of transparent flexible thin-film transistors using amorphous oxide semiconductors," *Nature*, vol. 432, Nov. 25, 2004, pp. 488-492.

Akihiro Takagi et al., "Carrier transport and electronic structure in amorphous oxide semiconductor, a-InGaZnO$_4$," *Thin Solid Films*. vol. 486 (2005) pp. 38-41.

Hideya Kumomi et al., "Amorphous Oxide Channel TFTs Fabricated with RF Sputtering Method," Proceedings of the 2nd international TFT Conference, 6.3, p. 176-179 (2006).

"Recent Trend of Flat Panel Display", by Toray Research Center, pp. 262-273 (with English translation), Mar. 25, 2004.

\* cited by examiner

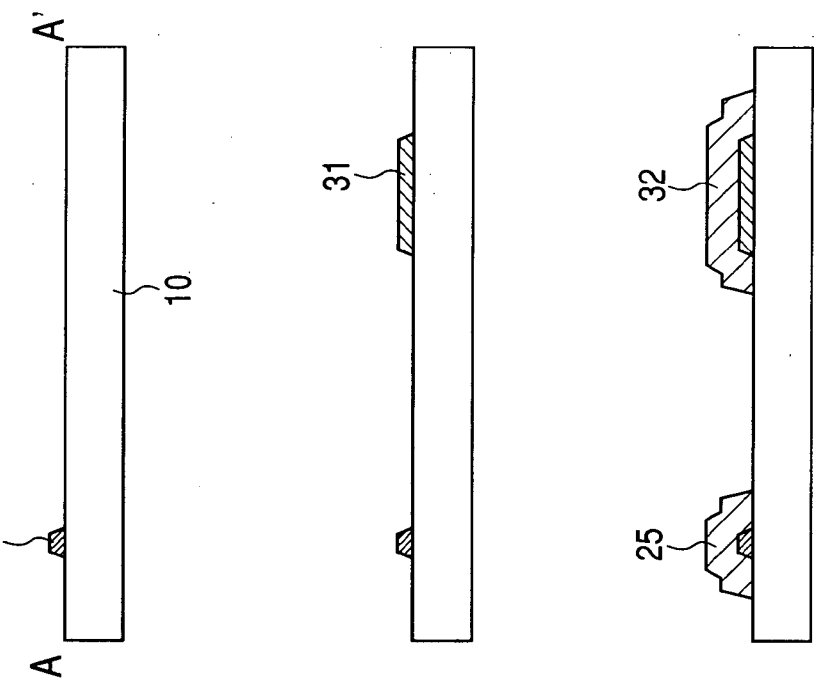
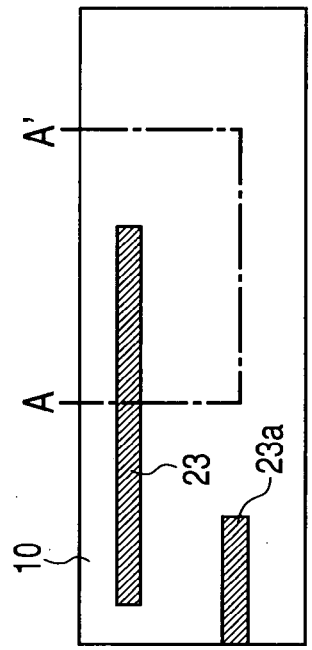
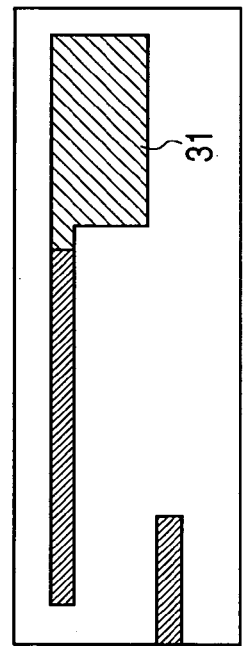
FIG. 5A
FIG. 5B
FIG. 5C

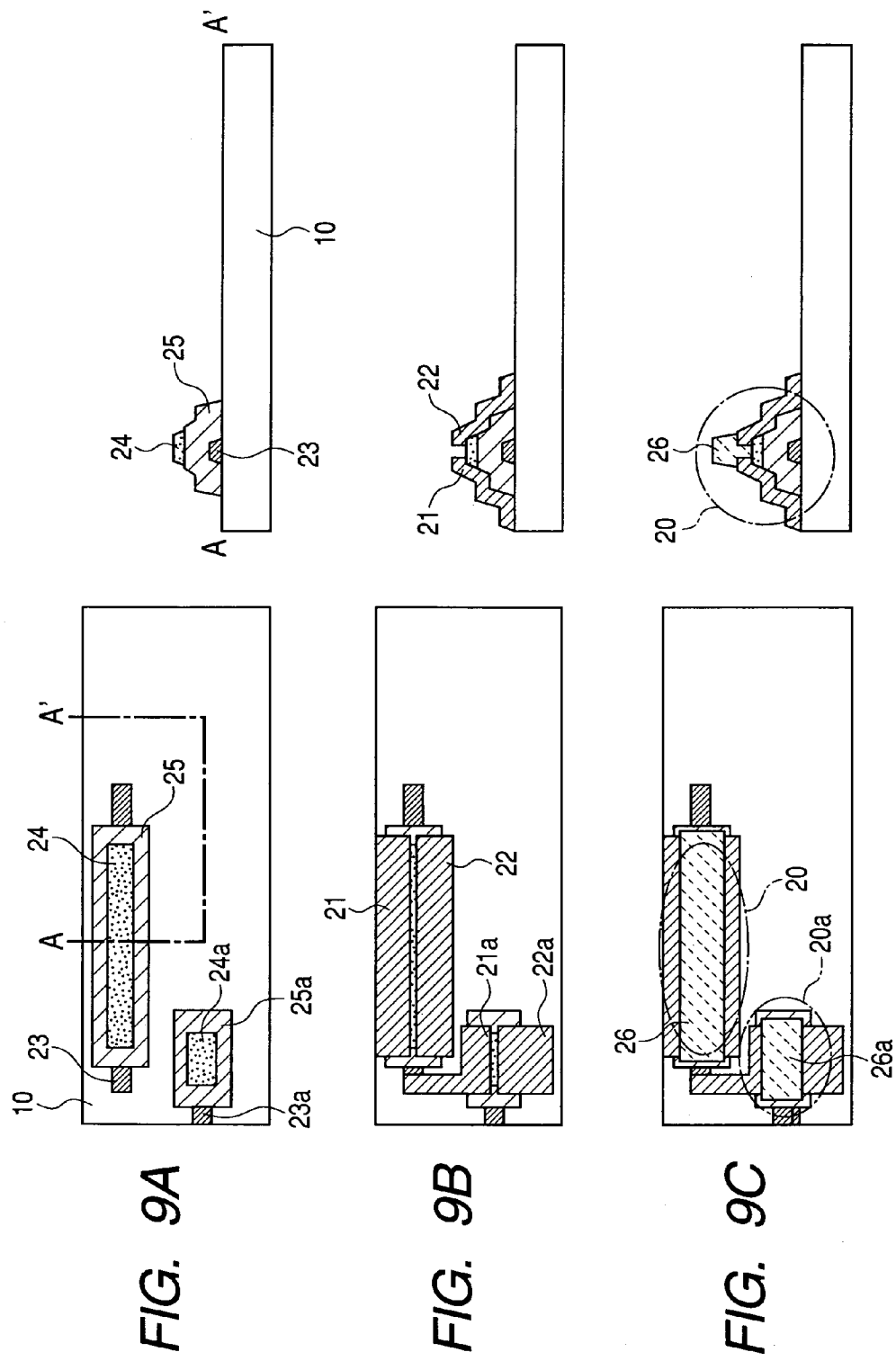

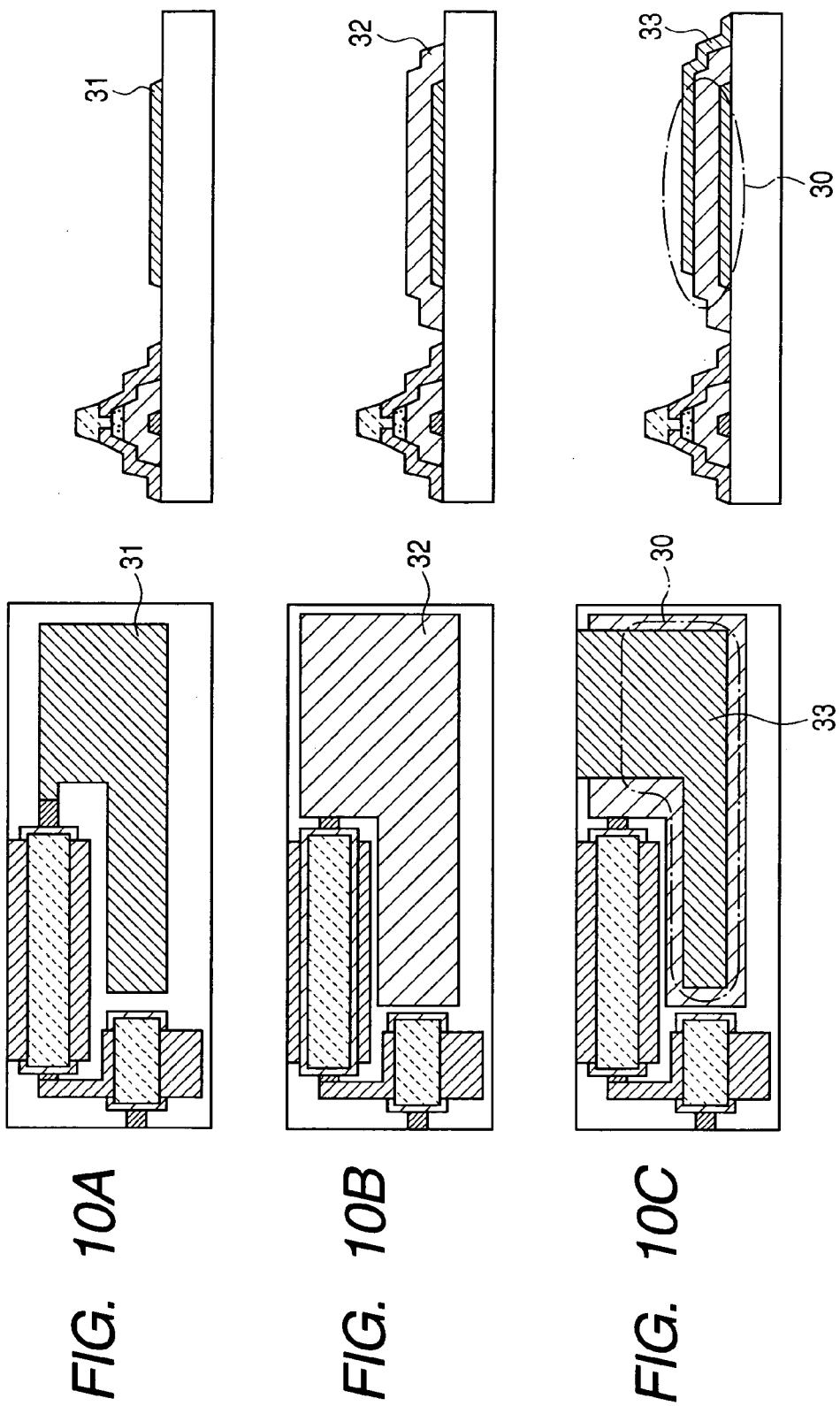

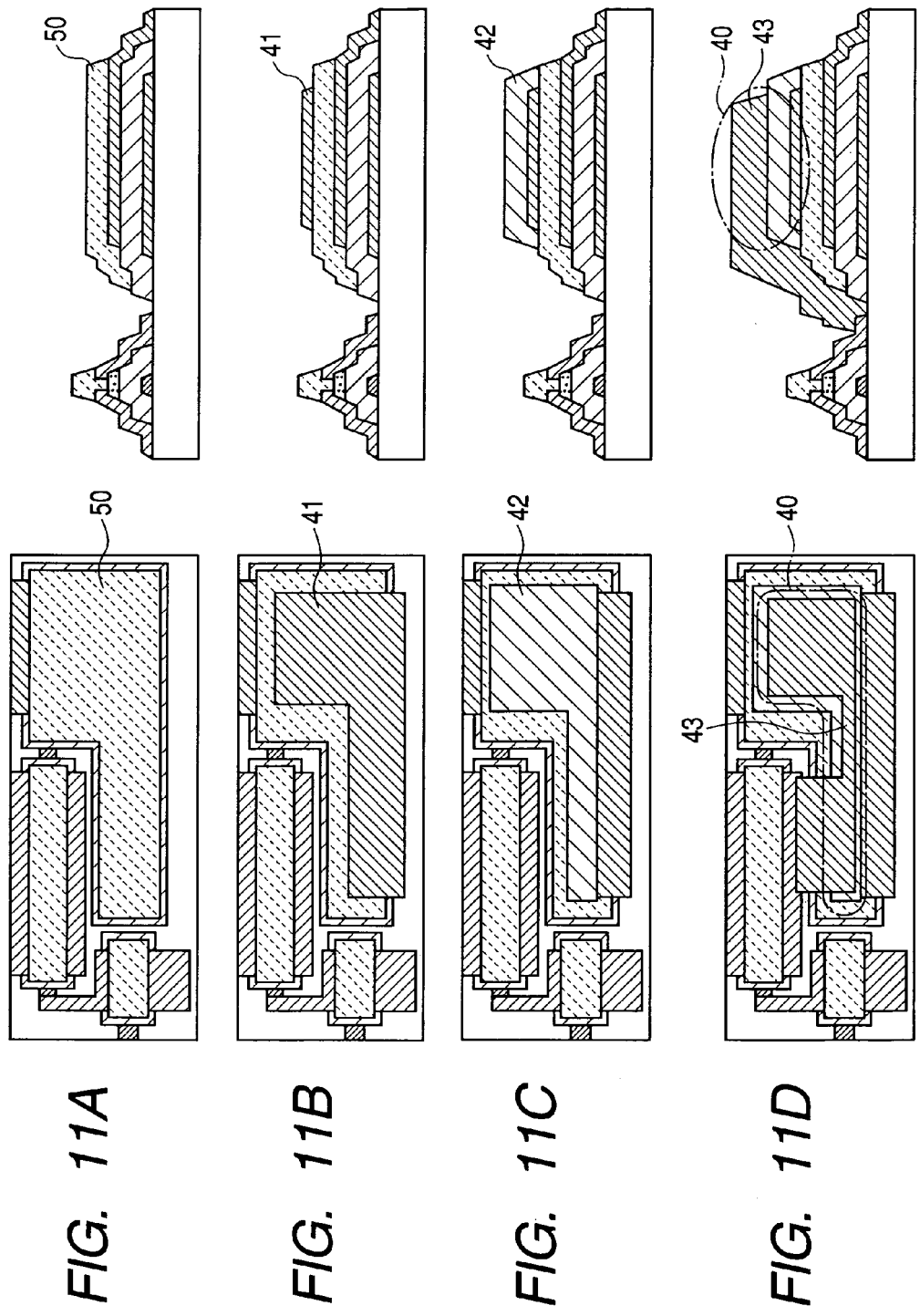

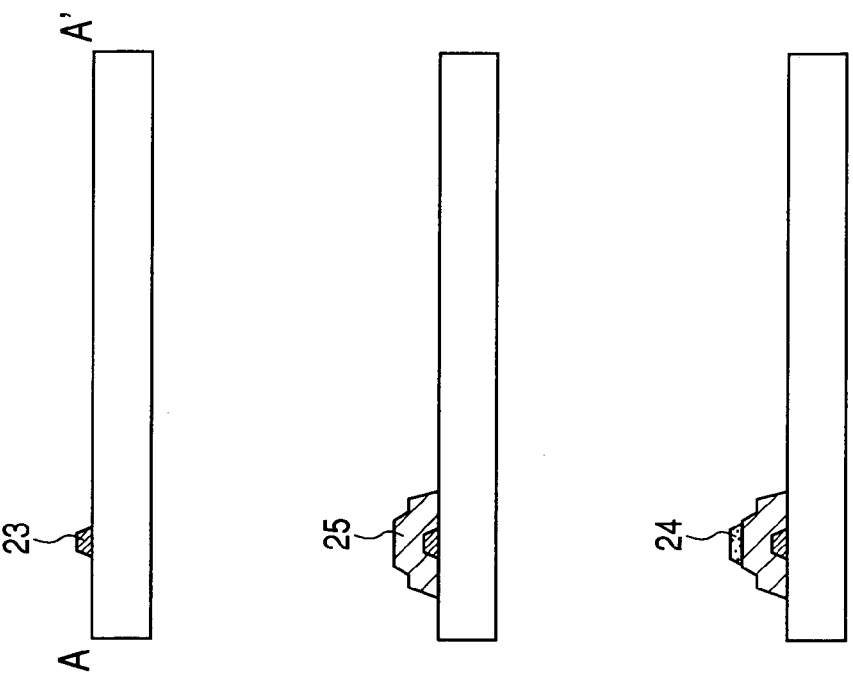
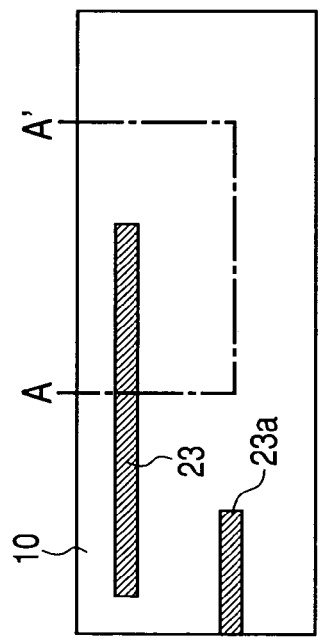
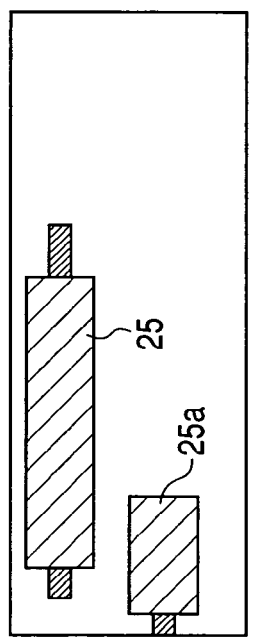
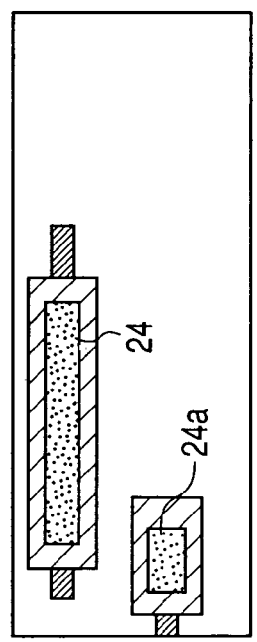
FIG. 12A  FIG. 12B  FIG. 12C

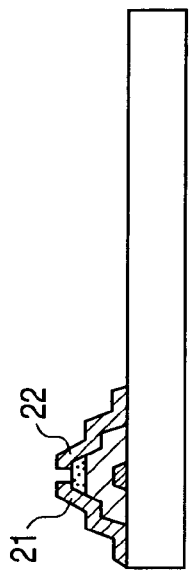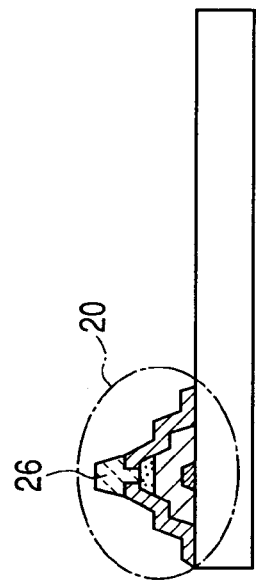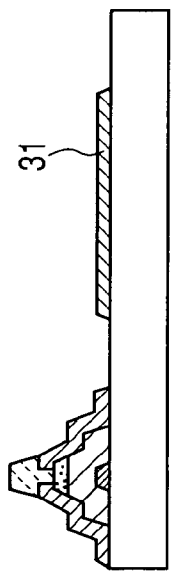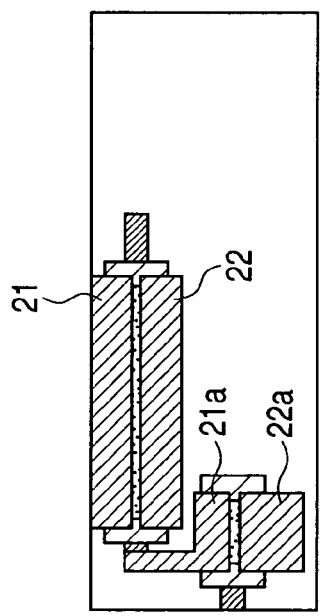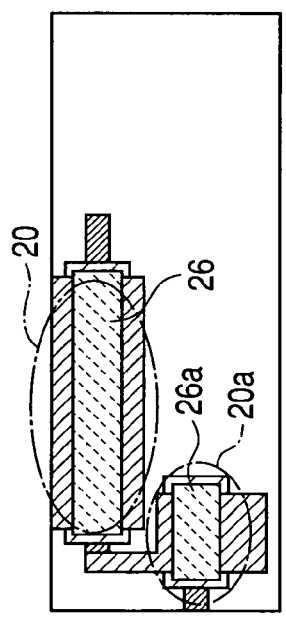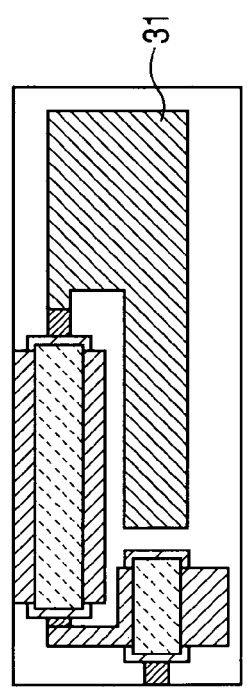
FIG. 13A  FIG. 13B  FIG. 13C

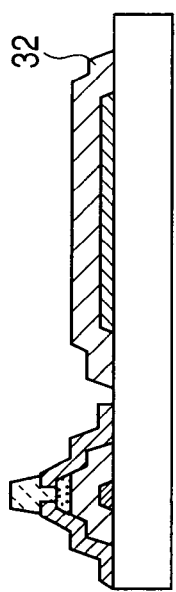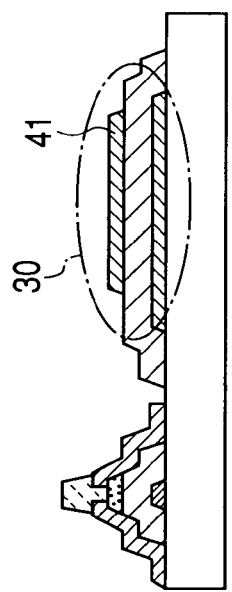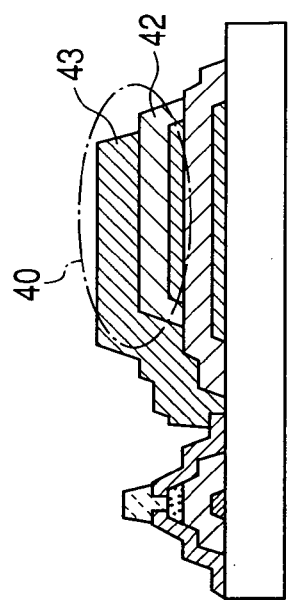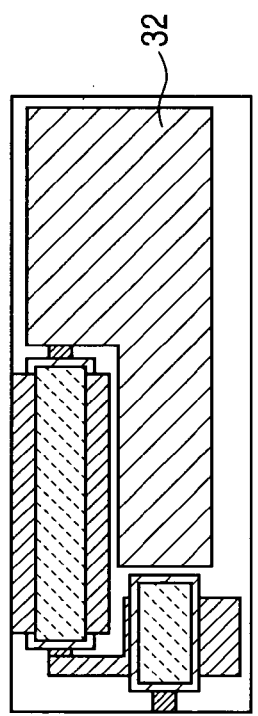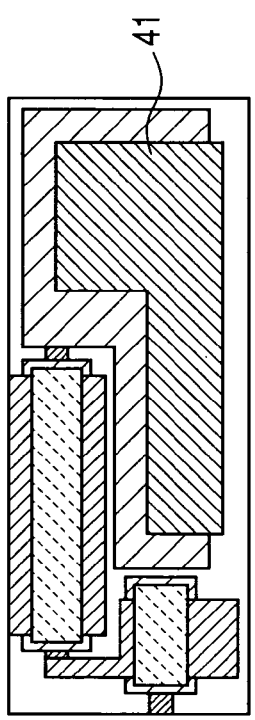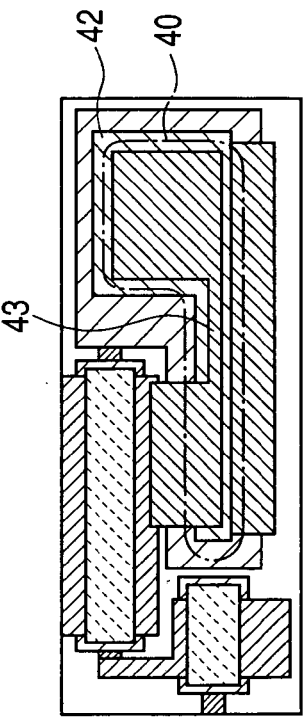
FIG. 14A   FIG. 14B   FIG. 14C

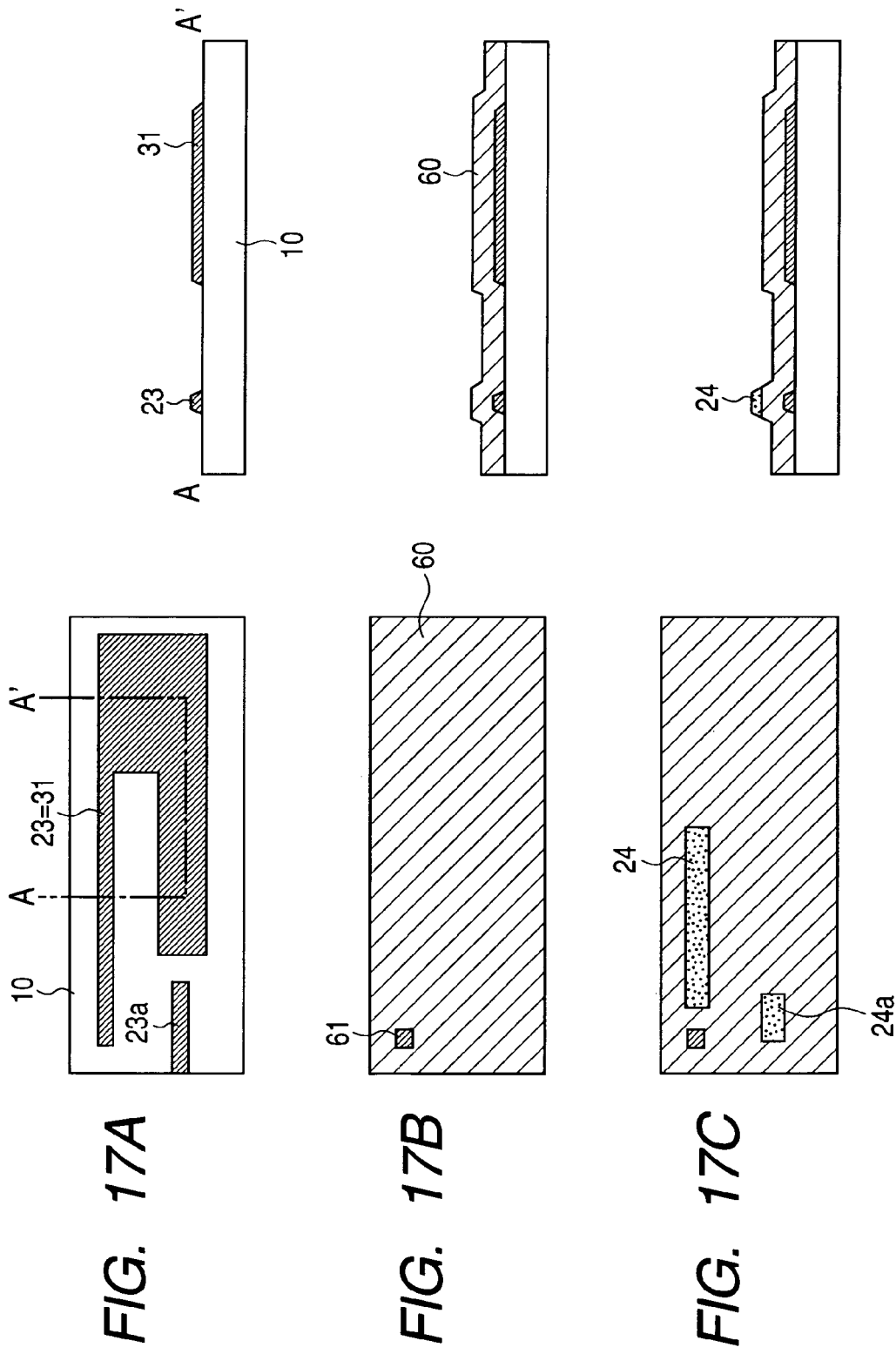

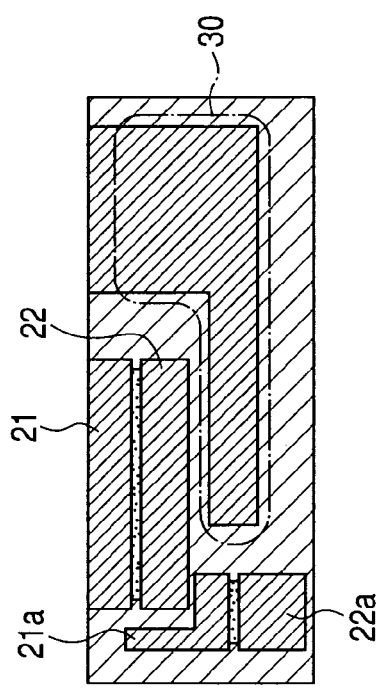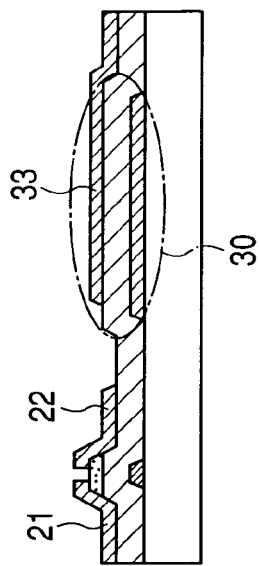
FIG. 18A
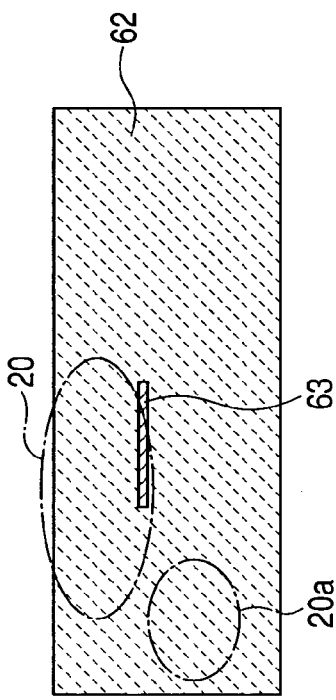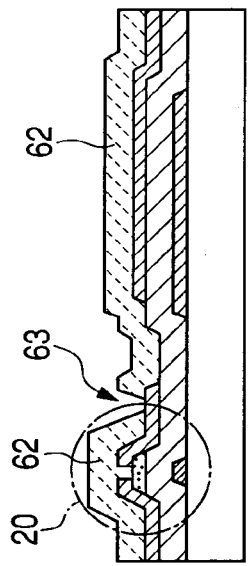
FIG. 18B
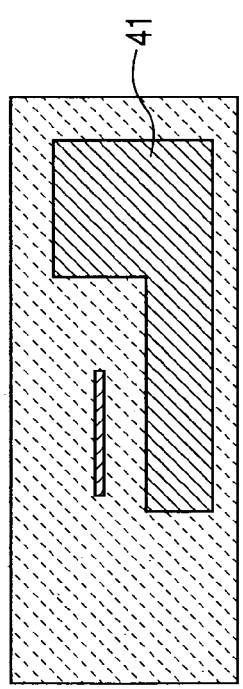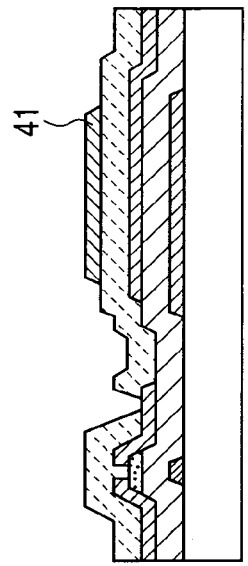
FIG. 18C

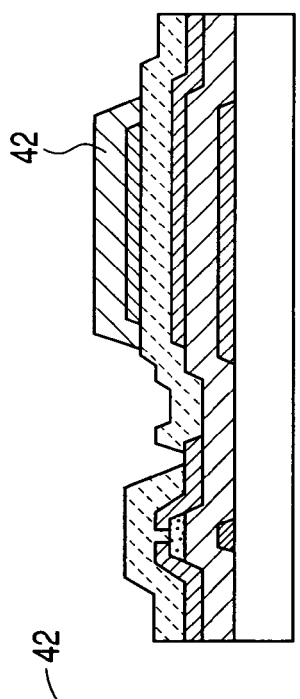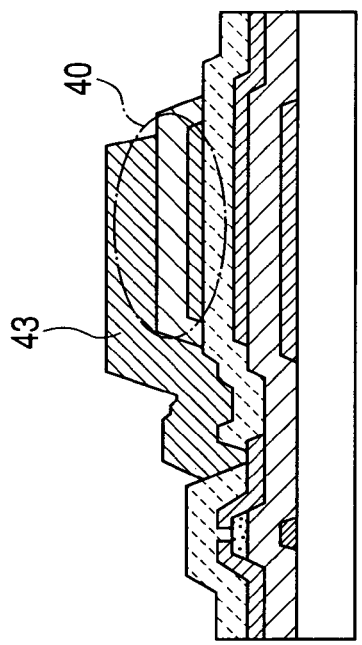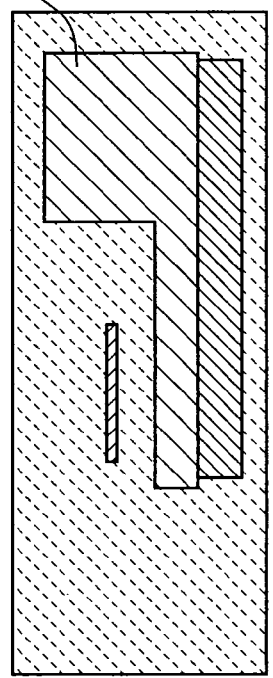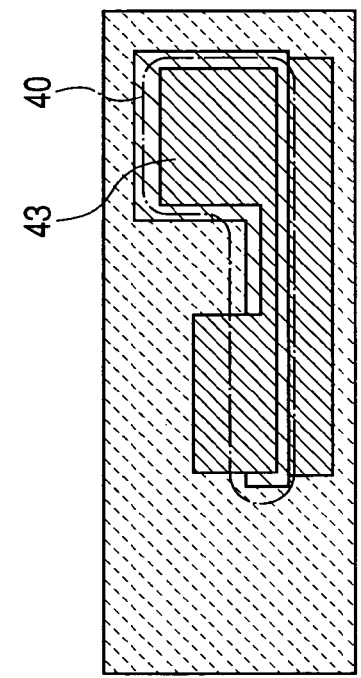
FIG. 19A  FIG. 19B

ACTIVE MATRIX DISPLAY APPARATUS

TECHNICAL FIELD

The present invention relates to active matrix display apparatuses and, in particular, to a bottom emission type of active matrix display apparatus having a high aperture ratio excellent in gradation controllability.

BACKGROUND ART

Display apparatuses utilizing organic light emitting diodes (OLEDs), hereinafter referred to as OLED displays, have become a focus of attention as next-generation display apparatuses.

The OLED displays are classified into a bottom emission type and a top emission type, depending upon the direction in which light-emitting elements emit light, as disclosed in "Recent Trend of Flat Panel Display (2004)" by Toray Research Center.

The bottom emission type, formed with light-emitting elements on a transparent substrate, utilizes the light emitted toward the substrate by the light-emitting elements through the substrate, while the top emission type utilizes the light emitted in the opposite direction to the substrate.

The deterioration of the OLED is accelerated with driving time, so that a terminal-to-terminal resistance increases.

The deterioration appears more remarkable as the driving current becomes larger.

Accordingly, increasing a ratio (an aperture ratio) of a light-emitting area in each pixel of a display apparatus can extend the lifetime of the OLED while ensuring fixed light intensity as the display apparatus.

Moreover, making each pixel maintain its light intensity during frame periods can lower driving current while ensuring light intensity required for the display apparatus to function. Accordingly, active matrix drive technology also becomes essential for long life of the display apparatus.

In recent years, the active matrix drive technology of the OLED by a thin film transistor (TFT) has been researched and developed actively.

FIG. 1 illustrates the most basic pixel circuit in active matrix drive with a transistor having a channel layer of n-type semiconductor.

Each pixel has two transistors (a switching transistor and a driving transistor).

While a sufficiently high voltage $V_{sel}$ (>0) is applied into a gate electrode of the switching transistor, conductivity between drain and source electrodes of the switching transistor is raised and a signal potential (=$V_{sig}$) is written into a gate electrode of the driving transistor.

Channel conductance of the driving transistor changes with the magnitude of $V_{sig}$ to permit control of the intensity of light emission.

After $V_{sel}$ is removed ($V_{sel}$ application is stopped), conductivity between the drain and the source electrodes of the switching transistor is lowered, so that a signal potential written in the driving transistor is retained and the light-emitting element retains light emission with the fixed intensity corresponding to $V_{sig}$.

Moreover, in many cases, a storage capacitor is added in parallel to the gate electrode of the driving transistor.

This is because an influence of gate leak current of the driving transistor and an influence of parasitic capacitance of the driving transistor or the switching transistor is alleviated to stably retain a gate potential of the driving transistor over frame periods.

In other words, the storage capacitor is essential in ensuring gradation controllability of a pixel circuit.

In recent years, development of transistors using transparent conducting oxide polycrystalline thin films for channel layers is on the increase.

For example, Nature (Volume 432, 2004, Pages 488 to 492) has disclosed a transistor using a transparent amorphous oxide semiconductor film with a composition ratio by X-ray fluorescence analysis of In:Ga:Zn=1.1:1.1:0.9 for a channel layer.

Each of the source electrode, the drain electrode and the gate electrode is made of tin-doped indium oxide (ITO).

Furthermore, Proceedings of the 2nd International TFT Conference, 6.3, Pages 176 to 179 (2006) has disclosed a transistor with channel layer made of RF sputter thin film (In—Ga—Zn—O thin film) using polycrystalline InGaZnO$_4$ target.

Each of the source electrode, the drain electrode and the gate electrode has a multilayered film made of titanium and gold. The above-described two types of transistors operate in an n-type enhancement mode.

DISCLOSURE OF THE INVENTION

In a display device using top emission type OLEDs, an OLED is formed on a transistor or a storage capacitor and utilizes light emission in an opposite direction to a substrate, which facilitates conversion to high aperture ratio without a light emitting-area being narrowed by the transistor or the storage capacitor.

However, after a planarization layer of 1 μm to several μm in thickness is formed between a transistor and an OLED, a contact hole is required to be formed on the layer. This complicates processes, thus causing difficult cost reduction.

On the other hand, a display apparatus using a bottom emission type OLED can relatively facilitate a manufacturing process.

However, because each electrode of a transistor and a storage capacitor has conventionally been formed from a metallic thin film through which visible light emitted from a light-emitting element will not pass, a range where the transistor and the storage capacitor having had no problems in a top emission type are laid out becomes a non-light-emission area, which has caused difficulties in aperture ratio.

Especially, there have been a problem with a decrease in the aperture ratio due to a layout area of the storage capacitor. More specifically, the layout area of the transistor is almost inversely proportional to field effect mobility of charges in a transistor channel layer.

Accordingly, if a material showing field effect mobility higher than some degree of magnitude is selected as a channel layer of a transistor, a non-light-emission region with the transistor becomes sufficiently small in practice.

On the other hand, the storage capacitor usually requires a magnitude of around 1 pF.

This means that even if a dielectric having SiO$_2$ of 100 nm in thickness is used, an area corresponding to 54 μm square has no light emission in the pixel area.

If a layout area of the storage capacitor is set smaller than the above value, gate leak current of the driving transistor cannot be neglected, so that a gate potential of the driving transistor cannot be stably retained. Accordingly, the gradation controllability of the pixel circuit becomes worse.

To put it all together, it was difficult to produce a bottom emission type of display apparatus having high aperture ratio excellent in gradation controllability.

In view of the above-described problems, it is an object of the present invention to provide a bottom emission type of display apparatus having high aperture ratio excellent in gradation controllability. In other words, it is an object of the present invention to provide a bottom emission type of display apparatus having concurrently high gradation controllability and high aperture ratio.

It is another object of the present invention to provide a bottom emission type of display apparatus capable of restraining fraction defective of a light-emitting element.

It is another object of the present invention to provide a bottom emission type of display apparatus capable of being manufactured according to a simpler manufacturing process.

It is still another object of the present invention to provide a bottom emission type of display apparatus capable of further stabilizing its transistor against external light.

According to the present invention, an active matrix display apparatus wherein a transistor, a storage capacitor and a light-emitting element are formed on a substrate, the transistor includes a source electrode, a drain electrode and a gate electrode, the storage capacitor has a multilayered structure of a first electrode, a dielectric layer and a second electrode stacked in this order on the substrate, the light-emitting element has a multilayered structure of a third electrode, a light-emitting layer and a fourth electrode stacked in this order on the substrate, the first electrode is electrically connected to the gate electrode of the transistor, at least a part of the storage capacitor is disposed between the substrate and the light-emitting element, all of the substrate, the first electrode, the second electrode and the third electrode are formed from a material transmitting a visible light.

The present invention provides a display apparatus which permits use of the light passing through the storage capacitor for display, thus attaining high aperture ratio.

Further features of the present invention will become apparent from the following description of exemplary embodiments with reference to the attached drawings.

BRIEF DESCRIPTION OF THE DRAWING

FIGS. 5A, 5B and 5C are views illustrating a method for manufacturing the light-emitting device according to the first embodiment of the present invention.

FIGS. 9A, 9B and 9C are views illustrating a method for manufacturing the light-emitting device according to the second embodiment of the present invention.

FIGS. 10A, 10B and 10C are views illustrating a method for manufacturing the light-emitting device according to the second embodiment of the present invention.

FIGS. 11A, 11B, 11C and 11D are views illustrating a method for manufacturing the light-emitting device according to the second embodiment of the present invention.

FIGS. 12A, 12B and 12C are views illustrating a method for manufacturing the light-emitting device according to the third embodiment of the present invention.

FIGS. 13A, 13B and 13C are views illustrating a method for manufacturing the light-emitting device according to the third embodiment of the present invention.

FIGS. 14A, 14B and 14C are views illustrating a method for manufacturing the light-emitting device according to the third embodiment of the present invention.

FIGS. 17A, 17B and 17C are views illustrating a method for manufacturing the light-emitting device according to the fourth embodiment of the present invention.

FIGS. 18A, 18B and 18C are views illustrating a method for manufacturing the light-emitting device according to the fourth embodiment of the present invention.

FIGS. 19A and 19B are views illustrating a method for manufacturing the light-emitting device according to the fourth embodiment of the present invention.

BEST MODES FOR CARRYING OUT THE INVENTION

One exemplary embodiment of the present invention will be more particularly described with reference to the accompanying drawings, in which:

First Embodiment

Figure 2:
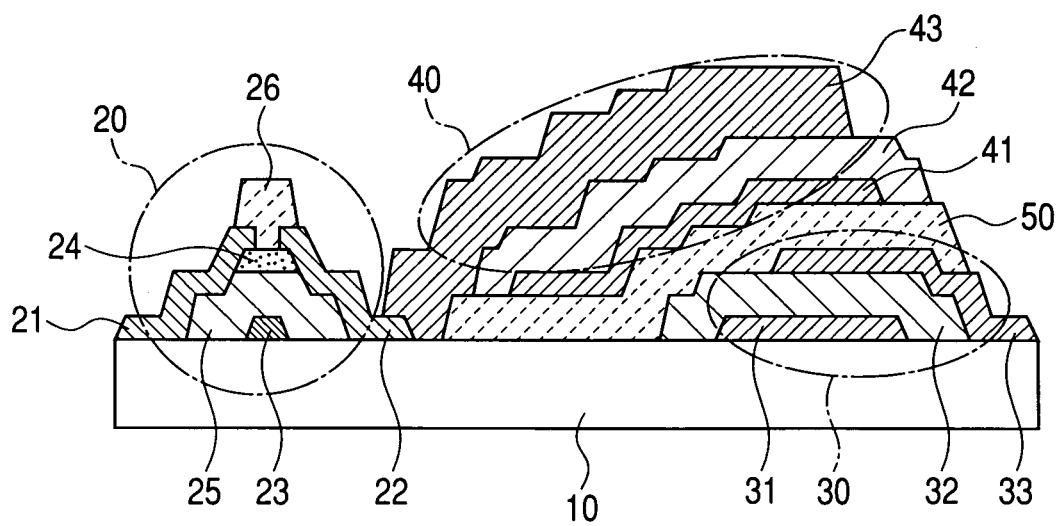
FIG. 2 is a cross-sectional view of a light-emitting device as a first embodiment of the present invention.

FIG. 2 is a cross-sectional view illustrating a part of the display device as the first embodiment of the present invention.

A transistor 20, a storage capacitor 30 and a light-emitting element 40 are formed on a substrate 10.

The transistor 20 has a source electrode 21, a drain electrode 22, a gate electrode 23, a channel layer 24, a gate insulating layer 25 and a channel protection layer 26.

The storage capacitor 30 has a first electrode 31, a dielectric layer 32 and a second electrode 33 stacked in this order on the substrate 10.

The light-emitting element 40 has a third electrode 41, a light-emitting layer 42 and a fourth electrode 43 stacked in this order on the substrate 10. The light-emitting element 40 may be formed to cover at least a part of the storage capacitor 30 as shown in FIG. 2.

The drain electrode 22 of the transistor 20 is connected with the fourth electrode 43 of the light-emitting element. The present invention is not limited to such a circuit, and can adopt such a circuit configuration that either of the source electrode 21 or the drain electrode 22 of the transistor 20 is connected with either of the third electrode 41 or the fourth electrode 43 of the light-emitting element.

At least a part of the storage capacitor 30 is provided between the substrate 10 and the light-emitting element 40. Moreover, a portion between the second electrode 33 of the storage capacitor 30 and the third electrode 41 of the light-emitting element 40 is insulated by an interlayer 50.

The storage capacitor 30 is connected between the gate electrode 23 of the transistor and an external reference power supply such as a ground power supply through a wiring or an external circuit (neither illustrated) to retain a signal voltage written in the gate electrode 23. Specifically, the first electrode 31 is connected with the gate electrode 23, while the second electrode 33 is connected with the external reference power supply for use.

Any of the third electrode 41 of the light-emitting element 40, the interlayer 50, the second electrode 33, dielectric layer 32 and the first electrode 31 of the storage capacitor, and the substrate 10 is transparent. At least a part of the light emitted from the light-emitting layer 42 of the light-emitting element 40 passes therethrough and is taken out to the outside.

The above-described structure can set the aperture ratio higher than a structure which permits visible light not to pass through the storage capacitor 30.

Accordingly, the present invention can concurrently attain both of high gradation controllability by sufficiently large storage capacitor and high aperture ratio.

Second Embodiment

Figure 3:
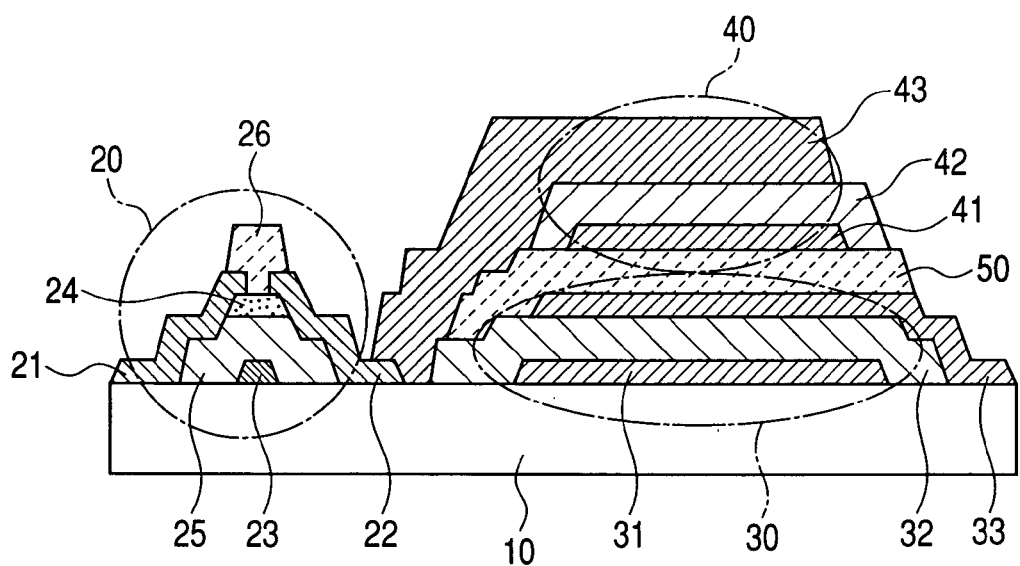
FIG. 3 is a cross-sectional view of a light-emitting device as a second embodiment of the present invention.

FIG. 3 is a cross-sectional view illustrating a part of a display device as a second embodiment of the present invention.

The present embodiment is a modification to the first embodiment of the present invention.

A transistor 20, a storage capacitor 30 and a light-emitting element 40 are formed on a substrate 10.

The transistor 20 has a source electrode 21, a drain electrode 22, a gate electrode 23, a channel layer 24, a gate insulating layer 25 and a channel protection layer 26.

The storage capacitor 30 has a first electrode 31, a dielectric layer 32 and a second electrode 33 stacked in this order on the substrate 10.

The light-emitting element 40 has a third electrode 41, a light-emitting layer 42 and a fourth electrode 43 stacked in this order on the substrate 10.

The drain electrode 22 of the transistor 20 is connected with the fourth electrode 43 of the light-emitting element. The present invention is not limited to such a circuit, and can adopt such a circuit configuration that either of the source electrode 21 or the drain electrode 22 of the transistor 20 is connected with either of the third electrode 41 or the fourth electrode 43 of the light-emitting element.

At least a part of the storage capacitor 30 is provided between the substrate 10 and the light-emitting element 40. Moreover, a portion between the second electrode 33 of the storage capacitor 30 and the third electrode 41 of the light-emitting element 40 is insulated by an interlayer 50.

When a surface of the substrate 10 is viewed from the top, desirably, a region for storing charges in the storage capacitor 30 includes or is equal to a light-emitting region of the light-emitting element 40. In other words, when a surface of the substrate 10 is viewed from the top, desirably, such a structure that a light-emitting region of the light-emitting element 40 is provided within a charge accumulation region of the storage capacitor 30.

In the present invention, the top view refers to an element structure when viewed from the normal direction of a surface of the substrate 10.

The storage capacitor 30 is connected with the gate electrode 23 of the transistor in parallel in the same way as for the embodiment in FIG. 2 to retain a signal voltage written in the gate electrode 23.

Any of the third electrode 41 of the light-emitting element, the interlayer 50, the second electrode 33, dielectric layer 32 and the first electrode 31 of the storage capacitor, and the substrate 10 is transparent. At least a part of the light emitted from the light-emitting layer 42 of the light-emitting element passes therethrough and is taken out to the outside.

If bottom surfaces of the third electrode 41, the fourth electrode 43 and the light-emitting layer 42 of the light-emitting element 40 have step differences in forming them, the respective layers may become discontinuous, sandwiching the step differences therebetween, and some sizes of the step differences cause the light-emitting element to have contact failure, short circuit or the like.

The present embodiment can flatten at least the bottom of a light-emitting portion of the light-emitting element and restrain the light-emitting portion of the light-emitting element from having some failure.

Third Embodiment

Figure 4:
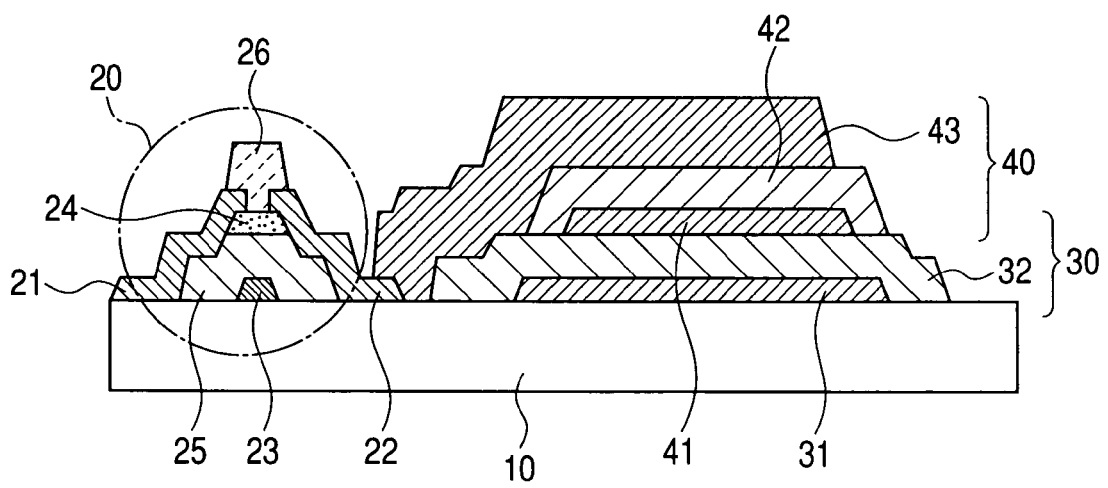
FIG. 4 is a cross-sectional view of a light-emitting device as a third embodiment of the present invention.

FIG. 4 is a cross-sectional view illustrating part of a display apparatus as a third embodiment of the present invention.

The present embodiment is a modification to the second embodiment of the present invention.

A transistor 20, a storage capacitor 30 and a light-emitting element 40 are formed on a substrate 10.

The transistor 20 has a source electrode 21, a drain electrode 22, a gate electrode 23, a channel layer 24, a gate insulating layer 25 and a channel protection layer 26.

The light-emitting element 40 has a third electrode 41, a light-emitting layer 42 and a fourth electrode 43 stacked in this order on the substrate 10.

The storage capacitor 30 has a first electrode 31 and a dielectric layer 32, and at least of a part of the third electrode 41 of the light-emitting element 40 stacked in this order on the substrate 10.

The drain electrode 22 of the transistor 20 is connected with the fourth electrode 43 of the light-emitting element. The present invention is not limited to such a circuit, and can adopt such a circuit configuration that either of the source electrode 21 or the drain electrode 22 of the transistor 20 is connected with either of the third electrode 41 or the fourth electrode 43 of the light-emitting element.

At least a part of the storage capacitor 30 is provided between the substrate 10 and the light-emitting element 40.

When a surface of the substrate 10 is viewed from the top, a region for storing charges of the storage capacitor 30 includes or is equal to a light-emitting region of the light-emitting element 40.

The storage capacitor 30 is connected between the gate electrode 23 of the transistor and an external reference power supply through a wiring or an external circuit (neither illustrated) to retain a signal voltage written in the gate electrode 23. Specifically, a first electrode 31 is connected with the gate electrode 23, while the third electrode 41 is connected with the external reference power supply for use.

Any of the third electrode 41 of the light-emitting element, an interlayer 50, a second electrode 33, a dielectric layer 32 and a first electrode 31 of the storage capacitor, and the substrate 10 is transparent. At least a part of the light emitted from the light-emitting layer 42 of the light-emitting element passes therethrough and is taken out to the outside.

The interlayer for partitioning the storage capacitor 30 from the light-emitting element 40 is abolished and further the third electrode 41 of the light-emitting element is also made to function as a second electrode of the storage capacitor, thus simplifying a manufacturing process.

The following additional information will be provided to the above-described embodiment:

There are some materials capable of being formed from a common member to a portion between the transistor and the storage capacitor, such as the gate electrode of the transistor and the first electrode of the storage capacitor, and the gate insulating layer of the transistor and the dielectric layer of the storage capacitor.

Simultaneous deposition by commonality with an arbitrary combination of these members can further simplify a manufacturing process.

In forming the gate electrode of the transistor and the first electrode of the storage capacitor out of another member, the former can be also formed from metal, while the latter can be formed from transparent conductive oxide.

Use of the gate electrode of the transistor opaque virtually against the light of a particular wavelength can restrain photoconduction of the transistor channel layer. Specifically, this permits avoidance of erroneous operation of the transistor caused by external light or the light emitted from the light-emitting element.

The present invention may be applicable to pixel circuits having more than one transistor and one storage capacitor per pixel.

Figure 1:
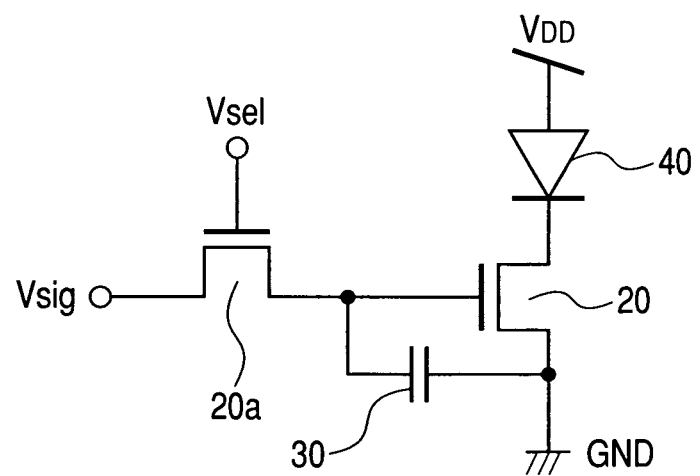
FIG. 1 is a diagram illustrating the most basic pixel circuit of an active matrix OLED display using n-channel transistors.

For example, in the pixel circuit configuration illustrated in FIG. 1, two transistors are used, however, the present invention can be implemented using a driving transistor of the two.

Gate electrodes of two or more different transistors may be connected with the electrode on the same side of the storage capacitor.

Furthermore, detailed description will be made on components of the above-described embodiment.

(Substrate)

Desirably, a substrate has insulating properties and high transparency to visible light. For example, glass, plastic or the like is used.

Where the light-emitting element is an OLED, sufficiently high flatness and barrier properties against moisture, oxygen or the like are required for restraint of light-emitting element deterioration and high yield.

A layer for having flatness and barrier, when uniformly laminated by one or more layers, is referred to as a substrate including the layers in function.

(Transistor)
(Structure)

The above description uses TFT of an inverted stagger structure as an example of a transistor, however, TFT of any of a stagger type, an inverted stagger type, a co-planar type and an inverted co-planar type may be used.

(Channel Layer)

One of an n-type and p-type semiconductor materials may be used.

One of an organic semiconductor and an oxide semiconductor, such as amorphous silicon, low-temperature polysilicon, pentacene and polythiophene is used.

As the oxide semiconductor, ZnO, $In_2O_3$, $Ga_2O_3$, mixed crystal of them, amorphous solid solution or the like may be used.

Especially, use of In—Ga—Zn—O sputter film permits manufacture of a transistor having sufficiently high field effect mobility.

Moreover, formation of channel material by sputtering method permits a light-emitting device having a large area to be manufactured.

Further, low film formation temperature of a channel material permits a light-emitting device to be manufactured on a flexible substrate such as plastic.

Each of the source electrode, the drain electrode and the gate electrode may be formed from transparent conducting oxide such as ITO.

At this time, because these electrodes and the electrode of the storage capacitor are integrally formed from the same type of material, it is desirable to simplify a manufacturing process.

Further, in In—Ga—Zn—O sputtering film, desirably, at least a part thereof is amorphous.

This improves etching processability.

In addition, the whole sputtering film made of amorphous material can prevent generation of variations in transistor characteristics between adjacent pixel circuits as seen in low-temperature polysilicon TFTs.

(Source Electrode and Drain Electrode)

A channel layer of n-type semiconductor requires a sufficiently small electron injection barrier from electrode to the channel layer.

A p-type semiconductor requires a sufficiently small hole injection barrier.

Metal such as Al, Cr, W, Ti and Au, or silicide such as Al alloy and WSi can be used.

Furthermore, transparent conducting oxide or transparent oxide semiconductor having high carrier concentration may be used.

ITO, zinc-doped indium oxide (IZO) or In—Ga—Zn—O sputtered films correspond to this.

Additionally, electrodes may be formed by connecting a plurality of materials. Further, a multilayered film formed from a plurality of materials may be used.

(Gate Electrode)

Any of a group of materials equivalent to the source electrode and the drain electrode is selectively used.

(Gate Insulating Layer)

A material which is capable of forming a flat film and has small conductivity is required.

Specifically, it is necessary to set a gate-source leak current $I_{gs}$ so as to be practically sufficiently smaller than a drain-source current $I_{ds}$.

A film can be formed from $SiN_x$, $SiO_x$ or $SiO_xN_y$ by Chemical vapor deposition (CVD). Otherwise, a film may be formed from $SiO_x$, $SiN_x$, $SiO_xN_y$, $Al_2O_3$, $Y_2O_3$, $HfO_2$, $Ta_2O_5$ and the like by RF magnetron sputter or a multilayered film formed therefrom.

The gate insulating layer may be formed from a transparent dielectric.

At this time, integral formation of the gate insulating layer and a dielectric of the storage capacitor or an interlayer from the same material can simplify a manufacturing process, which is desirable.

(Channel Protection Layer and Interlayer)

A channel protection layer protects the channel portion of the transistor from chemical fluid or atmosphere used in manufacturing process.

A channel protection layer uses a thermally or chemically stable insulator.

Use of a transparent material common to the gate insulating layer or the interlayer permits integral formation out of the same material as them and simplifies a manufacturing process, which is desirable.

Where the interlayer exists, the interlayer insulates and separates the storage capacitor from the light-emitting element.

A transparent insulating material is used.

Because a manufacturing process becomes simple, selection from the same group of materials as the gate insulating layer or channel protection layer of the transistor is desirable.

(Storage Capacitor)
(Transparent Electrode)

High transparency to visible light and high conductivity as an electrode are required. Further, flat film formation is required for prevention of a short-circuit in a storage capacitor.

Transparent conducting oxide or transparent oxide semiconductor with high carrier concentration, that is, sputtered thin-films of such as ITO, IZO and In—Ga—Zn—O are optimum.

A film made of metal or alloy thin enough to pass visible light may be used.

Because a manufacturing process becomes simple, selection from the same group of materials as any of the source electrode, the drain electrode and the gate electrode of a transistor is desirable.

(Dielectric Layer)

It is essential to use a material having high transparency and small leak current.

A single-layer or multi-layer film selected from the same group of materials as the gate insulating layer can be used.

Desirably, a multilayered structure of a transparent electrode and an interlayer has little reflection loss of visible light.

The reflectance for perpendicular incidence into a smooth interface of two types of materials having refraction indices of $n(1)$ and $n(2)$ respectively is expressed by the following equation:

$$R=\{(n(1)-n(2))/(n(1)+n(2))\}^2$$

For example, if the dielectric layer is formed from $SiN_x$ (refraction index—2.1), the reflectance per interface is approx. 0.06% when an electrode of the storage capacitor is ITO (refraction index—2).

If the interlayer 50 is formed from $SiN_x$ with such a structure as illustrated in FIG. 3, there are four ITO-$SiN_x$ interfaces and a total of these reflection losses is less than 0.3%.

To increase the visible light refraction index of the storage capacitor, an antireflection structure may be constructed by continuously or stepwise changing refraction index in the film-thickness direction, in any of the first electrode, the second electrode, the dielectric layer and the interlayer.

(Light-Emitting Element)
(Electrode)

The third electrode requires to be transparent.

The fourth electrode does not particularly require transparency. To increase the utilization efficiency of light from the light-emitting element, desirably, the reflectance against visible light is high.

The materials of the third and the fourth electrodes are selected from one of transparent conducting oxide and metal.

For effective charge injection into the light-emitting layer, desirably, one of these electrodes has a low work function (electron injection) and the other has a high work function (hole injection).

To enhance these properties, a material layer for adjusting a work function between the light-emitting layer and the electrode may be inserted into the light-emitting layer and the electrode. Combination examples are as follows:

Third electrode=Transparent conducting oxide (High work function), Fourth electrode=Metallic film (Low work function)

Third electrode=Transparent metallic thin-film (Low work function), Fourth electrode=Metallic film (High Work Function)

Third electrode=Transparent conducting oxide+Electron injection layer (Low work function) (e.g. ITO+Mg10 Å), Fourth electrode=Metal+Hole injection layer (High work function) (e.g. Al+$WO_3$)

(Light-Emitting Layer)

In practice, many multilayered films are used to obtain high light-emitting efficiency, however, which are integrally referred to as a light-emitting layer, neglecting a structure between the third and the fourth electrodes in the present invention for the convenience of description.

This is the same in each descriptive view as the above.

As the layered structure, any combination of the following layers is used.

Hole transporting layer and light-emitting layer/electron transporting layer (light-emitting layer having electron transport function); Hole transporting layer, light-emitting layer and electron transporting layer; Hole injection layer, hole transporting layer, light-emitting layer and electron transporting layer; or Hole injection layer, hole transporting layer, light-emitting layer, electron transporting layer and electron injection layer Desirably, the light-emitting layer is made of organic material. In this case, the light-emitting layer may be formed by means of vacuum deposition, coating method, printing method or the like, and may be formed on a substrate, such as plastic, having low maximum temperature in a formation process.

The light-emitting layer material capable of being formed by means of application method, printing method or the like can form a light-emitting layer over a large area at low cost, which is further preferable.

Exemplary Embodiments

First Embodiment

Manufacturing Method and Configuration

Referring to FIGS. 5A, 5B, 5C, 6A, 6B, 6C, 7A, 7B and 7C, a manufacturing method of a light-emitting device of a first embodiment of the present invention will be described.

A top view is illustrated at the left half of each view and an A-A' cross section in the each top view is illustrated at the right half, respectively.

As illustrated in FIG. 5A, first, the gate electrode 23 of the driving transistor and the gate electrode 23a of the switching transistor are formed with a multilayered film of titanium and gold on the substrate 10 (1737 glass substrate produced by Corning) by means of the sputtering method, using a titanium target and a gold target.

As illustrated in FIG. 5B, the first electrode 31 of the storage capacitor formed from ITO is formed by means of the sputtering method, using an ITO target and is connected with the gate electrode 23 of the driving transistor.

As illustrated in FIG. 5C, the gate insulating layer 25 of the driving transistor and the gate insulating layer 25a formed from $SiO_2$ of the switching transistor are formed by means of the sputtering method, using a $SiO_2$ target. As gas for sputter, Ar or $O_2$ may be used. Also, the dielectric layer 32 formed from SiN of the storage capacitor is formed by means of the sputtering method, using a SiN target. As gas for sputter, Ar may be used.

Figures 6A, 6B, 6C:
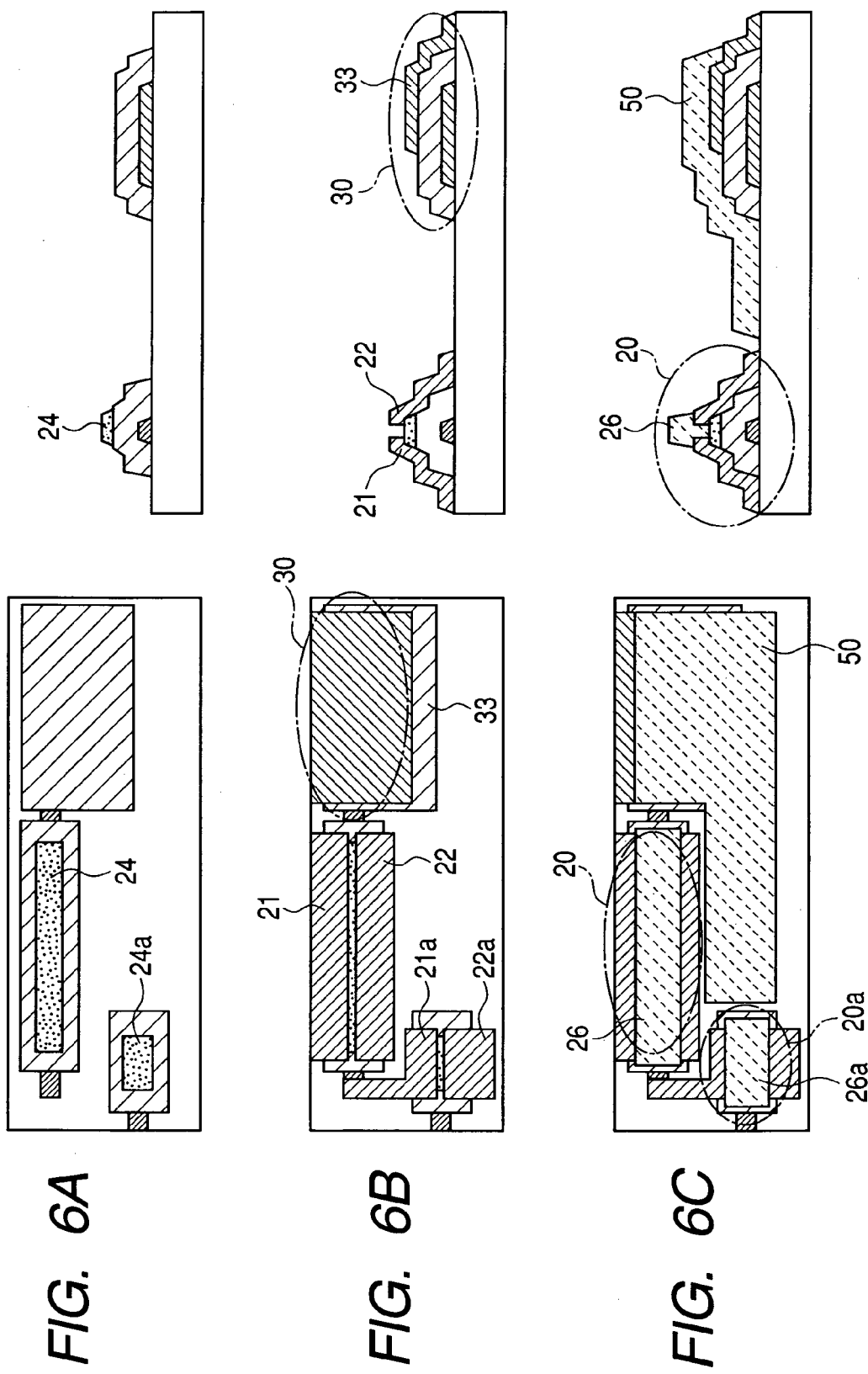
FIGS. 6A, 6B and 6C are views illustrating a method for manufacturing the light-emitting device according to the first embodiment of the present invention.

As illustrated in FIG. 6A, the channel layer 24 of the driving transistor formed from In—Ga—Zn—O and the channel layer 24a of the switching transistor are formed by means of the sputtering method, using an In—Ga—Zn—O target. As gas for sputter, Ar or $O_2$ may be used.

As illustrated in FIG. 6B, the source electrode 21 and the drain electrode 22 of the driving transistor and the source electrode 21a and the drain electrode 22a of the switching transistor are formed with a multilayered film of titanium and gold by means of the sputtering method. As gas for sputter, Ar may be used.

At this time, the source electrode 21a of the switching transistor extends to the gate electrode 23 of the driving transistor, so that both thereof are connected with each other.

The second electrode 33 formed from ITO of the storage capacitor is formed by means of the sputtering method to provide a storage capacitor 30.

As illustrated in FIG. 6C, the channel protection layer 26 of the driving transistor formed from $SiO_2$ and the channel protection layer 26a of the switching transistor are formed by means of the sputtering method to provide the driving transistor 20 and the switching transistor 20a.

An interlayer 50 formed from SiN is formed by means of the sputtering method.

Figure 7A:
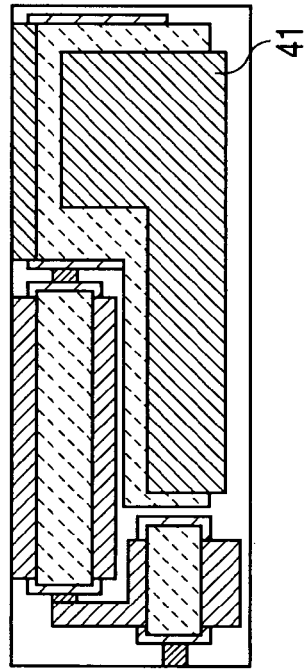
FIGS. 7A, 7B and 7C are views illustrating a method for manufacturing the light-emitting device according to the first embodiment of the present invention.

As illustrated in FIG. 7A, a third electrode 41 formed from ITO of the light-emitting element is formed by means of the sputtering method.

Figure 7B:
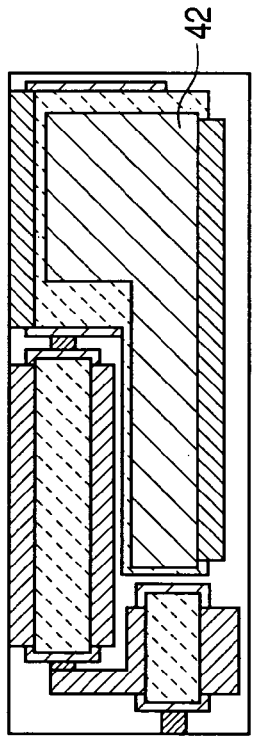

As illustrated in FIG. 7B, a bank (not illustrated) is formed into a particular shape by photosensitive polyimide to form a light-emitting layer 42 of a light-emitting element only in a desired region.

The following aqueous solution is applied to the inside of the bank in the following order and dried in an inert gas atmosphere to provide the light-emitting layer 42 of a light-emitting element.

As a material of a hole injection layer, poly(3,4-ethylenedioxythiophene)-poly(styrenesulfonate) (PEDOT:PSS) aqueous solution is used. Further, as a material of a light-emitting layer, LUMATION green 1303 solution produced by The Dow Chemical Company is used.

Figure 7C:
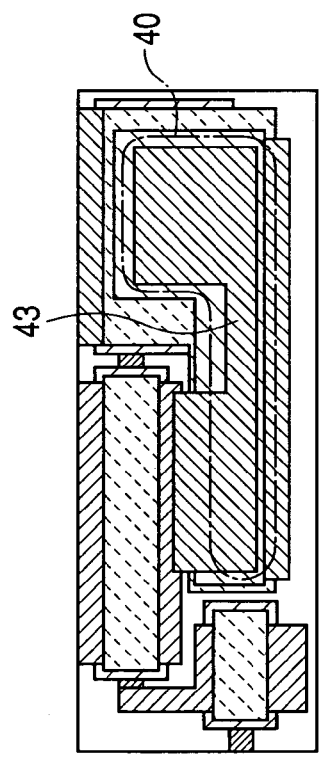

As illustrated in FIG. 7C, a fourth electrode 43 of a light-emitting element formed from a layer of lithium-doped aluminum is formed by means of the vacuum deposition, using lithium-doped aluminum for a deposition source to provide a light-emitting element 40.

The fourth electrode 43 is electrically connected with the drain electrode 22 of the driving transistor.

(Driving Mode)

Figure 8:
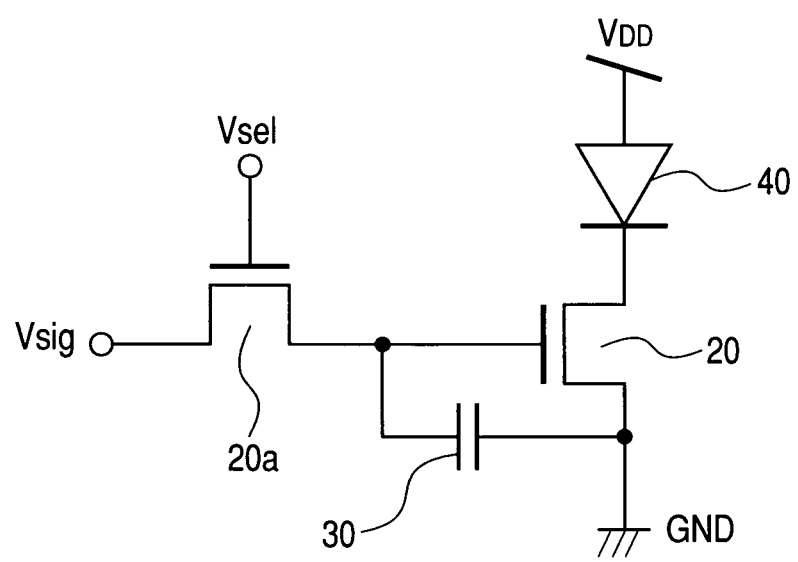
FIG. 8 is an equivalent circuit diagram for the light-emitting device according to the first embodiment of the present invention.

FIG. 8 is a circuit diagram illustrating an equivalent circuit of a light-emitting device obtained from the present invention.

Both the source electrode 21 of the driving transistor and the second electrode 33 of the storage capacitor are grounded and the third electrode 41 of the light-emitting element is connected with a positive DC power supply $V_{DD}$. A signal voltage $V_{sig}$ is applied to the drain electrode 22a of the switching transistor.

When a positive pulse-like voltage $V_{sel}$ is applied to the gate electrode 23a of the switching transistor, the potential $V_{sig}$ is written into the storage capacitor 30 to retain a potential of the gate electrode 23 of the driving transistor.

As a result, after a voltage to the gate electrode 23a is removed (voltage application is stopped), the light-emitting element maintains light emission of intensity corresponding to the magnitude of $V_{sig}$.

(Advantages)

Passing visible light through the third electrode, the second electrode, the dielectric layer, the first electrode and the substrate provides a display apparatus with high aperture ratio.

The light-emitting element, as an OLED, enables manufacture of a display apparatus on a substrate made of plastic or the like.

The gate electrode of the transistor, made of metal, can restrain photoconduction of the transistor.

Second Embodiment

A display apparatus can be manufactured according to almost the same manufacturing procedure as in the first embodiment, however, when a surface of a substrate 10 is seen from top view, a region for storing charges of a storage capacitor 30 includes a light-emitting region of a light-emitting element 40.

In other words, when viewed from the top, a region where a third electrode 41 and a fourth electrode 43 of the light-emitting element face each other is included in a region (a charge accumulation region of the storage capacitor) where a first electrode 31 and a second electrode 33 of the storage capacitor face each other.

(Manufacturing Method and Configuration)

Referring to FIGS. 9A, 9B, 9C, 10A, 10B, 10C, 11A, 11B, 11C and 11D, a manufacturing method of a light-emitting device to which the present invention is applicable will be described.

A top view is illustrated at the left half of each view and an A-A' cross section in the each top view is illustrated at the right half, respectively.

As illustrated in FIG. 9A, first, a gate electrode 23 of a driving transistor formed from a multilayered film of titanium and gold and a gate electrode 23a of a switching transistor are formed on the substrate 10 (1737 produced by Corning) by means of the sputtering method.

A gate insulating layer 25 of the driving transistor formed from $SiO_2$ and a gate insulating layer 25a of the switching transistor are formed by means of the sputtering method, using a $SiO_2$ target.

The channel layer 24 of the driving transistor formed from In—Ga—Zn—O and the channel layer 24a of the switching transistor are formed by means of the sputtering method, using an In—Ga—Zn—O target.

As illustrated in FIG. 9B, a source electrode 21 and a drain electrode 22 of the driving transistor formed from a multilayered film of titanium and gold and a source electrode 21a and a drain electrode 22a of the switching transistor are formed by means of the sputtering method, using a titanium target and a gold target.

At this time, the source electrode 21a of the switching transistor extends to the gate electrode 23 of the driving transistor, so that both thereof are connected with each other.

As illustrated in FIG. 9C, a channel protection layer 26 of the driving transistor formed from $SiO_2$ and a channel protection layer 26a of the switching transistor are formed by means of the sputtering method, using a $SiO_2$ target to provide a driving transistor 20 and a switching transistor 20a.

As illustrated in FIG. 10A, a first electrode 31 of the storage capacitor formed from ITO is formed by means of the sputtering method. This extends to the gate electrode 23 of the driving transistor to provide an electrical connection between the gate electrode 23 and the first electrode 31.

As illustrated in FIG. 10B, the dielectric layer 32 of the storage capacitor is formed from a sputtered thin film of SiN.

As illustrated in FIG. 10C, the second electrode 33 is formed from a sputtered thin film of ITO to provide the storage capacitor 30.

As illustrated in FIG. 11A, an interlayer 50 formed from SiN is formed by means of the sputtering method.

As illustrated in FIG. 11B, the third electrode 41 of a light-emitting element formed from ITO is formed by means of the sputtering method.

As illustrated in FIG. 11C, a bank (not illustrated) is formed into a particular shape by photosensitive polyimide to form a light-emitting layer 42 of a light-emitting element only in a desired region.

Inside the bank, the light-emitting layer 42 of the light-emitting element is provided using the same material and procedure as the first embodiment.

As illustrated in FIG. 11D, the fourth electrode 43 of the light-emitting element formed from lithium-doped aluminum is formed by means of the vacuum deposition, using lithium-doped aluminum for a deposition source to provide the light-emitting element 40.

The fourth electrode 43 is connected with the drain electrode 22 of the driving transistor.

When viewed from the top, a region where the third electrode 41 and the fourth electrode 43 of the light-emitting element face each other is included in a region where the first electrode 31 and the second electrode 33 of the storage capacitor face each other.

(Advantages)

The second embodiment has all advantages described in the first embodiment.

The present embodiment can flatten the bottom interface of the light-emitting region and restrain failure in the light-emitting element.

Third Embodiment

In the same way as the second embodiment, the present embodiment has a transparent capacitor in every bottom interface of the light-emitting area of the light-emitting element, however, can be manufactured in a simpler process, eliminating formation of the second electrode of the storage capacitor and the interlayer.

(Manufacturing Method and Configuration)

Referring to FIGS. 12A, 12B, 12C, 13A, 13B, 13C, 14A, 14B and 14C, a manufacturing method of a light-emitting device to which the present invention is applicable will be described.

A top view is illustrated at the left half of each view and an A-A' cross section in the each top view is illustrated at the right half, respectively.

As illustrated in FIG. 12A, a gate electrode 23 of a driving transistor formed from a multilayered film of titanium and gold and a gate electrode 23a of a switching transistor are formed on a substrate 10 (1737 produced by Corning) by means of the sputtering method, using a titanium and gold target.

As illustrated in FIG. 12B, a gate insulating layer 25 of the driving transistor formed from $SiO_2$ and a gate insulating layer 25a of the switching transistor are formed by means of the sputtering method, using a $SiO_2$ target.

As illustrated in FIG. 12C, a channel layer 24 of the driving transistor formed from In—Ga—Zn—O and a channel layer 24a of the switching transistor are formed by means of the sputtering method, using an In—Ga—Zn—O target.

As illustrated in FIG. 13A, a source electrode 21 and a drain electrode 22 of the driving transistor formed from a multilayered film of titanium and gold and the source electrode 21a and a drain electrode 22a of the switching transistor are formed by means of the sputtering method, using a titanium target and a gold target.

At this time, the source electrode 21a of the switching transistor extends to the gate electrode 23 of the driving transistor, so that both thereof are electrically connected with each other.

As illustrated in FIG. 13B, a channel protection layer 26 of the driving transistor formed from $SiO_2$ and a channel protection layer 26a of the switching transistor are formed by means of the sputtering method, using a $SiO_2$ target to provide a driving transistor 20 and a switching transistor 20a.

As illustrated in FIG. 13C, a first electrode 31 of the storage capacitor is formed from an sputtered thin film of ITO.

This extends to the gate electrode 23 of the driving transistor to provide an electrical connection between the gate electrode 23 and the first electrode 31.

As illustrated in FIG. 14A, a dielectric layer 32 of the storage capacitor formed from SiN is formed by means of the sputtering method, using a SiN target.

As illustrated in FIG. 14B, a third electrode 41 of a light-emitting element formed from ITO is formed by means of the sputtering method, using an ITO target. At this time, a third electrode 41 functions as a counter electrode to the first electrode 31 of the storage capacitor to provide the storage capacitor 30.

As illustrated in FIG. 14C, a bank (not illustrated) is formed into a particular shape by photosensitive polyimide to form a light-emitting layer 42 of a light-emitting element only in a desired region.

Inside the bank, the light-emitting layer 42 of the light-emitting element is formed.

The fourth electrode 43 of the light-emitting element formed from lithium-doped aluminum is formed by means of the vacuum deposition, using lithium-doped aluminum for a deposition source to provide the light-emitting element 40. The fourth electrode 43 is connected with the drain electrode 22 of the driving transistor.

When viewed from the top, a region where the third electrode 41 and the fourth electrode 43 of the light-emitting element face each other is included in a region where the first electrode 31 and the third electrode 41 of the storage capacitor face each other.

(Driving Mode)

Figure 15:
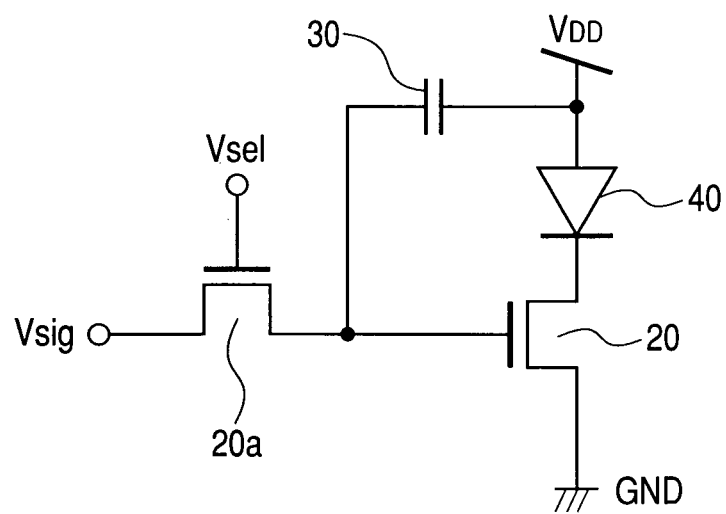
FIG. 15 is an equivalent circuit diagram for the light-emitting device according to the third embodiment of the present invention.

FIG. 15 is a circuit diagram illustrating an equivalent circuit of a light-emitting device obtained from the present invention.

Both the source electrode 21 of the driving transistor and the second electrode 33 of the storage capacitor are grounded and the third electrode 41 of the light-emitting element is connected with a positive DC power supply $V_{DD}$. A signal voltage $V_{sig}$ is applied to the drain electrode 22a of the switching transistor.

When a positive pulse-like voltage $V_{sel}$ is applied to the gate electrode 23a of the switching transistor, the potential $V_{sig}$ is written into the first electrode 31 of the storage capacitor to retain a potential of the gate electrode 23 of the driving transistor.

As a result, even after a pulse voltage to the gate electrode 23a is turned off, light emission of the intensity corresponding to the magnitude of $V_{sig}$ is maintained.

(Advantages)

The third embodiment has all advantages described in Embodiment 2.

No need of formation of a second electrode of a storage capacitor and an interlayer provides a light-emitting device with a smaller number of manufacturing processes than in the second embodiment.

Fourth Embodiment

Figure 16:
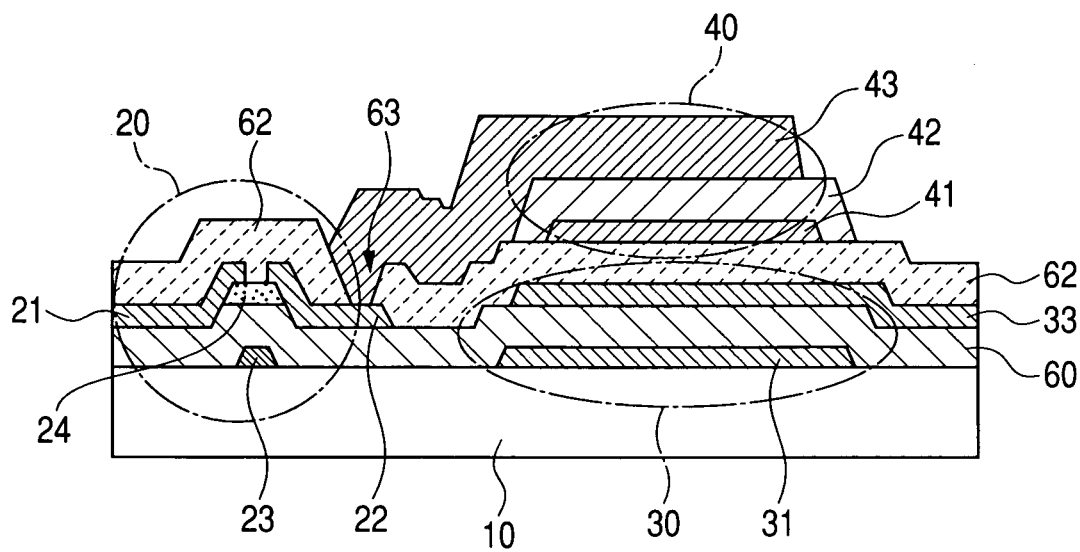
FIG. 16 is a cross-sectional view for the light-emitting device according to a fourth embodiment of the present invention.

FIG. 16 is a cross-sectional view illustrating another light-emitting device to which the present invention is applicable.

One of the features of the present embodiment describing the present invention and subsequent embodiments is that members capable of being commonized in transistors and storage capacitors are commonized for integral formation.

(Manufacturing Method and Configuration)

Referring to FIGS. 17A, 17B, 17C, 18A, 18B, 18C, 19A and 19B, a manufacturing method of a light-emitting device to which the present invention is applicable will be described. A top view is illustrated at the left half of each view and an A-A' cross section in the each top view is illustrated at the right half, respectively.

As illustrated in FIG. 17A, an sputtered thin film of ITO is formed on the substrate 10 (1737 produced by Corning) followed by etching. This provides the gate electrode 23 of the driving transistor, the gate electrode 23a of the switching transistor and the first electrode 31 of the storage capacitor, respectively.

These components can be simultaneously obtained with one etching process from a single sputtered thin film. Moreover, the gate electrode 23 of the driving transistor is integral with the first electrode 31 of the storage capacitor.

As illustrated in FIG. 17B, a common dielectric layer 60 formed from $SiO_2$ is formed from a sputtered thin film, using a $SiO_2$ target as the gate insulating layer of the driving transistor, the gate insulating layer of the switching transistor and the dielectric layer of the storage capacitor.

Etching forms a contact hole 61 in a part of the common dielectric layer 60 on the gate electrode 23 of the driving transistor.

As illustrated in FIG. 17C, the channel layer 24 of the driving transistor and the channel layer 24a of the switching transistor are respectively obtained by etching an In—Ga—Zn—O film formed by means of the sputtering method.

As illustrated in FIG. 18A, an ITO film formed by means of the sputtering method is etched. This provides the source electrode 21 and the drain electrode 22 of the driving transistor, the source electrode 21a and the drain electrode 22a of the switching transistor and the second electrode 33 of the storage capacitor, respectively.

At this time, the source electrode 21a of the switching transistor extends to a contact hole 61, so that the switching transistor and the driving transistor are electrically connected with each other.

As illustrated in FIG. 18B, a common dielectric layer 62 formed from $SiO_2$ is formed by means of the sputtering method, using a $SiO_2$ target as a channel protection layer 26 of the driving transistor, a channel protection layer 26a of the switching transistor and an interlayer 50.

This provides the driving transistor 20 and the switching transistor 20a.

Etching forms a contact hole 63 in a part of the common dielectric layer 62 on the drain electrode 22 of the driving transistor.

As illustrated in FIG. 18C, a third electrode 41 of a light-emitting element is formed from ITO by means of the sputtering method, using an ITO target.

As illustrated in FIG. 19A, a bank (not illustrated) is formed into a particular shape by photosensitive polyimide to form a light-emitting layer 42 of a light-emitting element only in a desired region.

Inside the bank, a light-emitting layer 42 of the light-emitting element is formed.

As illustrated in FIG. 19B, a fourth electrode 43 of the light-emitting element is formed from a vacuum deposited lithium-doped aluminum film to provide a light-emitting element 40.

The fourth electrode 43 extends to a contact hole 63, which connects the driving transistor 20 with the light-emitting element 40.

When viewed from the top, a region where the third electrode 41 and the fourth electrode 43 of the light-emitting element face each other is included in a region where the first electrode 31 and the second electrode 33 of the storage capacitor face each other.

FIG. 8 is a circuit diagram illustrating an equivalent circuit of a light-emitting device obtained from the present invention.

(Advantages)

The fourth embodiment has all advantages described in the second embodiment.

The gate electrode and the first electrode of the storage capacitor, the gate insulating layer and the dielectric layer, the source and drain electrodes and the second electrode, and the channel protection layer and the interlayer are the same member respectively, thus attaining a light-emitting device with a significantly smaller number of manufacturing processes than in the second embodiment.

Fifth Embodiment

Manufacturing Method and Configuration

Figure 20:
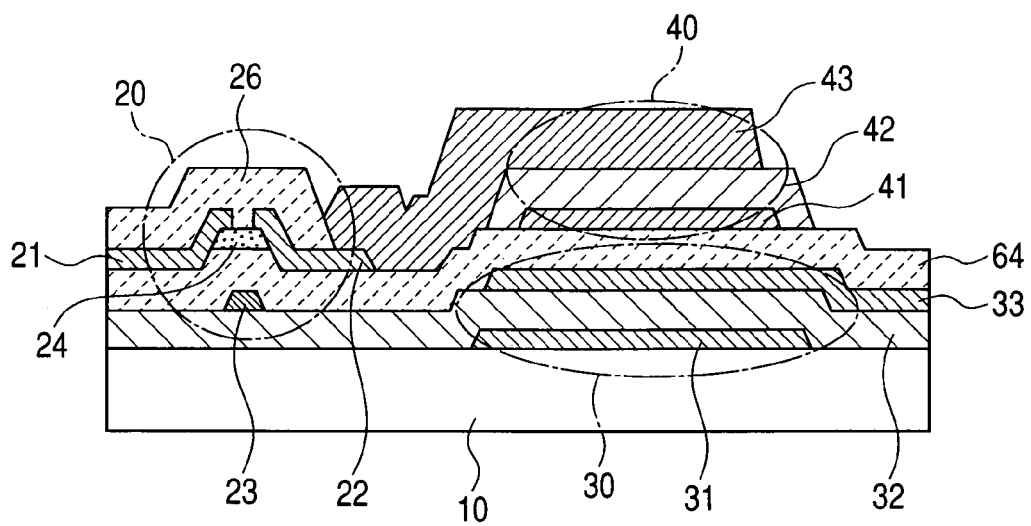
FIG. 20 is a cross-sectional view for the light-emitting device according to a fifth embodiment of the present invention.

Referring to FIG. 20, a manufacturing method of a light-emitting device to which the present invention is applicable will be described.

A first electrode 31 of a storage capacitor formed from ITO and a dielectric layer 32 formed from $SiO_2$ are respectively formed on a substrate 10 (1737 produced by Corning) by means of the sputtering method, using an ITO target and a $SiO_2$ target.

An ITO film is formed thereon by means of the sputtering method and patterning by etching is performed to obtain a gate electrode 23 of the transistor and a second electrode 33 of the storage capacitor respectively. The gate insulating film 23 is connected to the first electrode 31 out of the cross-sectioned view.

A common dielectric layer 64 formed from $SiO_2$ is formed from a sputtered thin film, using a $SiO_2$ target as the gate insulating layer of the transistor and the interlayer for separating the storage capacitor from the light-emitting element.

An In—Ga—Zn—O film is formed thereon by means of the sputtering method and patterning by etching is performed to form a channel layer 24 of the transistor.

An ITO film is formed thereon by means of the sputtering method using an ITO target and patterning by etching is performed to obtain a source electrode 21 and a drain electrode 22 of the transistor and a third electrode 41 of the light-emitting element.

A channel protection layer 26 of the transistor is formed from a sputtered thin film of $SiO_2$.

A bank (not illustrated) is formed into a particular shape by photosensitive polyimide to form a light-emitting layer 42 of a light-emitting element only in a desired region.

Inside the bank, a light-emitting layer 42 of the light-emitting element is formed.

A fourth electrode 43 of the light-emitting element formed from lithium-doped aluminum is formed by means of the vacuum deposition, using lithium-doped aluminum for a deposition source. At this time, the fourth electrode 43 extends to the drain electrode 22 of the transistor, which makes an electrical connection between the transistor and the light-emitting element.

When viewed from the top, a region where the third electrode 41 and the fourth electrode 43 of the light-emitting element face each other is included in a region where the first electrode 31 and the second electrode 33 of the storage capacitor face each other.

(Advantages)

The fifth embodiment has all advantages described in the second embodiment.

The gate electrode and the second electrode of the storage capacitor, the gate insulating layer and the interlayer, the source and drain electrodes and the third electrode of the light-emitting element are the same member respectively, thus attaining a light-emitting device with a smaller number of manufacturing processes than in the second embodiment.

Sixth Embodiment

Manufacturing Method and Configuration

Figure 21:
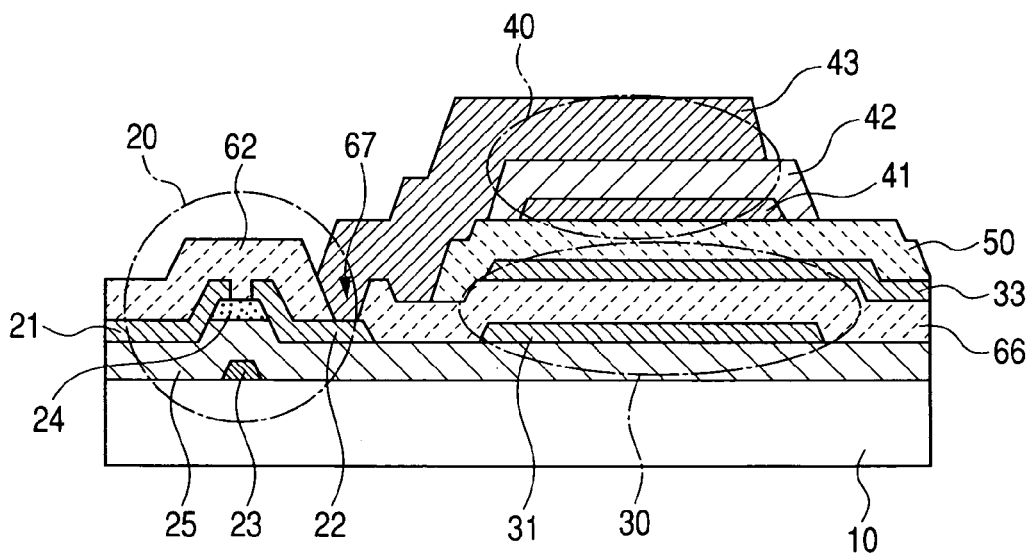
FIG. 21 is a cross-sectional view for the light-emitting device according to a sixth embodiment of the present invention.

Referring to FIG. 21, a manufacturing method of a light-emitting device to which the present invention is applicable will be described.

A gate electrode 23 of a transistor and a gate insulating film 25 are respectively formed from a sputtered thin film of ITO and a sputtered thin film of $SiO_2$ on a substrate 10 (1737 produced by Corning).

An In—Ga—Zn—O film is formed thereon by means of the sputtering method, using an In—Ga—Zn—O target and patterning by etching is performed to form a channel layer 24 of the transistor.

An ITO film is formed thereon by means of the sputtering method and patterning by etching is performed to obtain a source electrode 21 and a drain electrode 22 of a transistor and a first electrode 31 of a storage capacitor, respectively. A first electrode 31 is connected with a gate electrode 23 out of a cross-sectional view.

A common dielectric layer 66 formed from $SiO_2$ is formed, using a $SiO_2$ target by means of the sputtering method as a channel protection layer of the transistor and a dielectric film of the storage capacitor. A contact hole 67 is provided in a part of the common dielectric layer 66 on the drain electrode 22.

A second electrode 33 of the storage capacitor formed from ITO, an interlayer 50 formed from $SiO_2$ and a third electrode 41 of the light-emitting element formed from ITO are respectively formed by means of the sputtering method, using an ITO target and a $SiO_2$ target.

A bank (not illustrated) is formed into a particular shape by photosensitive polyimide to form a light-emitting layer 42 of a light-emitting element only in a desired region.

Inside the bank, a light-emitting layer 42 of the light-emitting element is formed.

The fourth electrode 43 of the light-emitting element formed from lithium-doped aluminum is formed by means of the vacuum deposition, using lithium-doped aluminum for a deposition source. At this time, a fourth electrode 43 extends to the contact hole 67, which makes an electrical connection with the drain electrode 22 of the transistor.

When viewed from the top, a region where the third electrode 41 and the fourth electrode 43 of the light-emitting element face each other is included in a region where the first electrode 31 and the second electrode 33 of the storage capacitor face each other.

(Advantages)

The sixth embodiment has all advantages described in the second embodiment.

The source and drain electrodes and the first electrode of the storage capacitor, and the channel protection layer and the dielectric layer are the same member respectively, thus attaining a light-emitting device with a smaller number of manufacturing processes than in the second embodiment.

Seventh Embodiment

Manufacturing Method and Configuration

Figure 22:
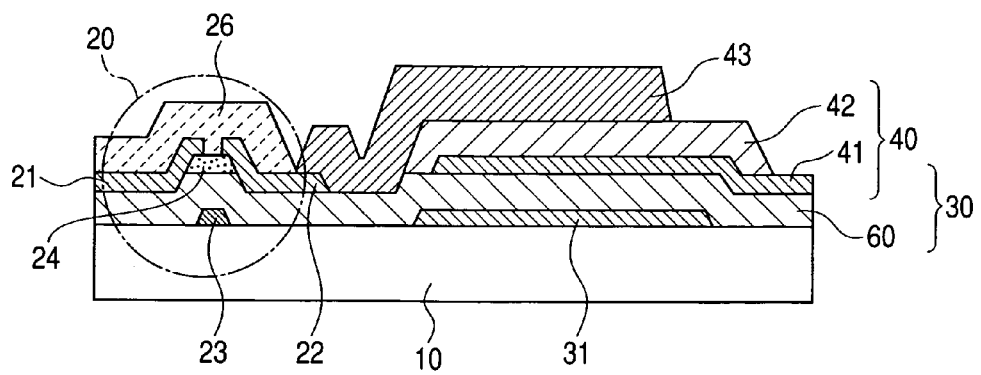
FIG. 22 is a cross-sectional view for the light-emitting device according to a seventh embodiment of the present invention.

Referring to FIG. 22, a manufacturing method of a light-emitting device to which the present invention is applicable will be described.

An ITO film is formed on a substrate 10 by means of the sputtering method, using an ITO target and patterning by etching is performed to obtain a gate electrode 23 of a transistor and a first electrode 31 of a storage capacitor, respectively.

The gate electrode 23 of the transistor is integral with the first electrode 31 of the storage capacitor out of a cross-sectional view.

A common dielectric layer 60 formed from $SiO_2$ is formed by means of the sputtering method, using a $SiO_2$ target as the gate insulating layer of the transistor and the dielectric layer of the storage capacitor.

An In—Ga—Zn—O film is formed thereon by means of the sputtering method, using an In—Ga—Zn—O target and patterning by etching is performed to form a channel layer 24 of the transistor.

An ITO film is formed thereon by means of the sputtering method using an ITO target, and patterning by etching is performed to obtain a source electrode 21 and a drain electrode 22 of the transistor and the third electrode 41 of the light-emitting element, respectively.

The storage capacitor 30 is formed from a first electrode 31, a common dielectric layer 60 and a third electrode 41.

A channel protection layer 26 of the transistor formed from $SiO_2$ is formed by means of the sputtering method, using a $SiO_2$ target.

This provides a transistor 20.

A bank (not illustrated) is formed into a particular shape by photosensitive polyimide to form a light-emitting layer 42 of a light-emitting element only in a desired region.

Inside the bank, the light-emitting layer 42 of the light-emitting element is formed.

A fourth electrode 43 of the light-emitting element formed from lithium-doped aluminum is formed by means of the vacuum deposition, using lithium-doped aluminum for a deposition source. At this time, the fourth electrode 43 extends to the drain electrode 22 of the transistor, which makes an electrical connection between the transistor and the light-emitting element.

When viewed from the top, a region where the third electrode 41 and the fourth electrode 43 of the light-emitting element face each other is included in a region where the first electrode 31 and the third electrode 41 of the storage capacitor face each other.

(Advantages)

The seventh embodiment has all advantages described in the third embodiment.

The gate electrode and the first electrode of the storage capacitor; the gate insulating layer and the dielectric layer; and the source electrode, drain electrode and the second electrode; are the same member respectively, thus attaining a light-emitting device with a significantly smaller number of manufacturing processes than in the third embodiment.

Eighth Embodiment

Manufacturing Method and Configuration

Figure 23:
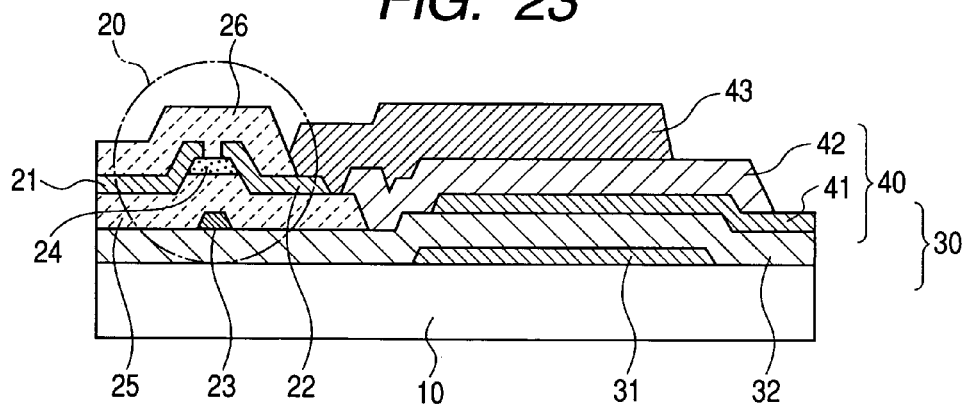
FIG. 23 is a cross-sectional view for the light-emitting device according to an eighth embodiment of the present invention.

Referring to FIG. 23, a manufacturing method of a light-emitting device to which the present invention is applicable will be described.

A first electrode 31 of a storage capacitor formed from ITO and the dielectric layer 32 formed from $SiO_2$ are respectively formed on the substrate 10 (1737 produced by Corning) by means of the sputtering method, using an ITO target and a $SiO_2$ target.

An ITO film is formed thereon by means of the sputtering method, using an ITO target and patterning by etching is performed to obtain the gate electrode 23 of the transistor and the third electrode 41 of the light-emitting element respectively. A gate electrode 23 is connected with the first electrode 31 out of a cross-sectional view.

A storage capacitor 30 is formed from the first electrode 31, the dielectric layer 32 and the third electrode 41.

A gate insulating layer 25 of a transistor formed from $SiO_2$ and a channel layer 24 formed from In—Ga—Zn—O are formed by means of the sputtering method, using a $SiO_2$ target and an In—Ga—Zn—O target.

A source electrode 21 and a drain electrode 22 of the transistor formed from ITO are formed by means of the sputtering method, using an ITO target.

A channel protection layer 26 of the transistor formed from $SiO_2$ is formed by means of the sputtering method, using a $SiO_2$ target.

A bank (not illustrated) is formed into a particular shape by photosensitive polyimide to form a light-emitting layer 42 of a light-emitting element only in a desired region.

Inside the bank, a light-emitting layer 42 of a light-emitting element is formed.

A fourth electrode 43 of the light-emitting element is formed from a vacuum deposited aluminum film doped with lithium. At this time, the fourth electrode 43 extends to the drain electrode 22 of the transistor, which makes an electrical connection between the transistor and the light-emitting element.

When viewed from the top, a region where the third electrode 41 and the fourth electrode 43 of the light-emitting element face each other is included in a region where the first electrode 31 and the third electrode 41 of the storage capacitor face each other.

(Advantages)

The eighth embodiment has all advantages described in the third embodiment.

The gate electrode and the first electrode of the storage capacitor are the same member, thus attaining a light-emitting device with a smaller number of manufacturing processes than in the third embodiment.

Ninth Embodiment

Manufacturing Method and Configuration

Figure 24:
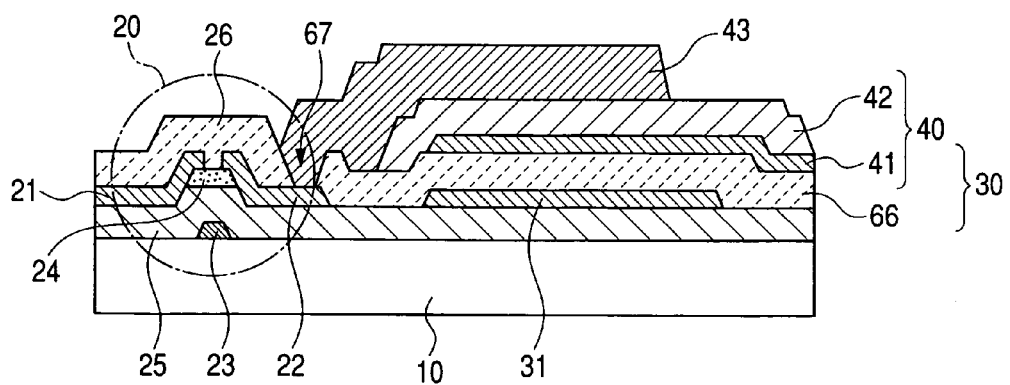
FIG. 24 is a cross-sectional view for the light-emitting device according to a ninth embodiment of the present invention.

Referring to FIG. 24, a manufacturing method of a light-emitting device to which the present invention is applicable will be described.

A gate electrode 23 of a transistor formed from ITO and a gate insulating layer 25 formed from $SiO_2$ are respectively formed on a substrate 10 (1737 produced by Corning) by means of the sputtering method, using an ITO target and a $SiO_2$ target.

An In—Ga—Zn—O film is formed thereon by means of the sputtering method, using an In—Ga—Zn—O target and patterning by etching is performed to form a channel layer 24 of the transistor.

An ITO film is formed thereon by means of the sputtering method, using an ITO target and patterning by etching is performed to obtain a source electrode 21 and a drain electrode 22 of the transistor and a first electrode 31 of the storage capacitor respectively. The first electrode 31 is connected with the gate electrode 23 out of a cross-sectional view.

A common dielectric layer 66 formed from $SiO_2$ is formed, using a $SiO_2$ target by means of the sputtering method as the channel protection layer of the transistor and the dielectric film of the storage capacitor. A contact hole 67 is provided in a part of the common dielectric layer 66 on the drain electrode 22.

A first electrode 41 of the light-emitting element is formed from a sputtered thin film of ITO. The storage capacitor 30 is formed from the first electrode 31, the common dielectric layer 66 and the third electrode 41.

A bank (not illustrated) is formed into a particular shape by photosensitive polyimide to form a light-emitting layer 42 of a light-emitting element only in a desired region.

Inside the bank, the light-emitting layer 42 of the light-emitting element is formed.

A fourth electrode 43 of the light-emitting element is formed from a vacuum deposited film of lithium-doped aluminum. At this time, the fourth electrode 43 extends to the contact hole 67, which makes a connection with the drain electrode 22 of the transistor.

When viewed from the top, a region where the third electrode 41 and the fourth electrode 43 of the light-emitting element face each other is included in a region where the first electrode 31 and the third electrode 41 of the storage capacitor face each other.

(Advantages)

The ninth embodiment has all advantages described in the third embodiment.

The source and drain electrodes and the first electrode of the storage capacitor, and the channel protection layer and the dielectric layer are the same member respectively, thus attaining a light-emitting device with a smaller number of manufacturing processes than in the third embodiment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-017874, filed Jan. 29, 2007, which is hereby incorporated by reference herein in its entirety.

The invention claimed is:

1. An active matrix display apparatus, comprising:
a transistor, a storage capacitor, and a light-emitting element formed on a substrate,
the transistor comprising a source electrode, a drain electrode, and a gate electrode,
the storage capacitor having a multilayered structure of a first electrode, a dielectric layer, and a second electrode stacked in this order on the substrate, and
the light-emitting element having a multilayered structure of a third electrode, a light-emitting layer, and a fourth electrode stacked in this order on the substrate,
wherein the first electrode is electrically connected to the gate electrode of the transistor,
wherein at least a part of the storage capacitor is disposed between the substrate and the light-emitting element,
wherein all of the substrate, the first electrode, the second electrode, and the third electrode are formed from a material transmitting a visible light emitted by the light-emitting element,
wherein viewing from a normal direction of a surface of the substrate, a light-emitting region of the light-emitting element is provided within a charge accumulating region of the storage capacitor, and
wherein the light emitting region is a region where the third electrode and the fourth electrode directly face each other.

2. The active matrix display apparatus according to claim 1, wherein the light-emitting layer is formed from one or more organic materials.

3. The active matrix display apparatus according to claim 1, wherein the transistor has a channel layer containing In, Ga and Zn, and partially formed from an amorphous oxide.

4. The active matrix display apparatus according to claim 1, wherein the gate electrode and the first electrode are formed in the same process step, and
wherein the gate electrode comprises a conductive oxide which is a same material as a conductive oxide comprised in the first electrode.

5. The active matrix display apparatus according to claim 1, wherein the gate electrode is formed from a metal, and the first electrode is formed from a transparent conductive oxide.

6. The active matrix display apparatus according to claim 1, wherein the fourth electrode is exposed to the substrate.

7. The active matrix display apparatus according to claim 1, wherein the drain electrode is in contact with the fourth electrode.

8. The active matrix display apparatus according to claim 1, wherein the light emitting region of the light emitting element comprises an OLED.

9. An active matrix display apparatus, comprising:
a transistor, a storage capacitor, and a light-emitting element formed on a substrate,
the transistor comprising a source electrode, a drain electrode, and a gate electrode,
the storage capacitor having a multilayered structure of a first electrode, a dielectric layer, and a second electrode stacked in this order on the substrate, and
the light-emitting element having a multilayered structure of a third electrode, a light-emitting layer, and a fourth electrode stacked in this order on the substrate,
wherein the first electrode is electrically connected to the gate electrode of the transistor,
wherein at least a part of the storage capacitor is disposed between the substrate and the light-emitting element,
wherein all of the substrate, the first electrode, the second electrode, and the third electrode are formed from a material transmitting a visible light emitted by the light-emitting element,
wherein viewing from a normal direction of a surface of the substrate, a light-emitting region of the light-emitting element is provided within a charge accumulating region of the storage capacitor, and
wherein the light emitting region is a region where the third electrode and the fourth electrode overlap each other in the normal direction.

10. The active matrix display apparatus according to claim 9, wherein the light-emitting layer is formed from one or more organic materials.

11. The active matrix display apparatus according to claim 9, wherein the transistor has a channel layer containing In, Ga and Zn, and partially formed from an amorphous oxide.

12. The active matrix display apparatus according to claim 9, wherein the gate electrode and the first electrode are formed in the same process step, and
wherein the gate electrode comprises a conductive oxide which is a same material as a conductive oxide comprised in the first electrode.

13. The active matrix display apparatus according to claim 9, wherein the gate electrode is formed from a metal, and the first electrode is formed from a transparent conductive oxide.

14. The active matrix display apparatus according to claim 9, wherein the fourth electrode is exposed to the substrate.

15. The active matrix display apparatus according to claim 9, wherein the drain electrode is in contact with the fourth electrode.

16. The active matrix display apparatus according to claim 9, wherein the light emitting region of the light emitting element comprises an OLED.

* * * * *